United States Patent
Liu et al.

(10) Patent No.: US 10,573,812 B2
(45) Date of Patent: Feb. 25, 2020

(54) BURIED LOW-RESISTANCE METAL WORD LINES FOR CROSS-POINT VARIABLE-RESISTANCE MATERIAL MEMORIES

(71) Applicant: Micron Technology, Inc., Boise, ID (US)

(72) Inventors: Jun Liu, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/127,984

(22) Filed: Sep. 11, 2018

(65) Prior Publication Data

US 2019/0027684 A1    Jan. 24, 2019

Related U.S. Application Data

(62) Division of application No. 15/606,624, filed on May 26, 2017, now Pat. No. 10,090,464, which is a
(Continued)

(51) Int. Cl.
  *H01L 45/00*    (2006.01)
  *G11C 13/00*    (2006.01)
  (Continued)

(52) U.S. Cl.
  CPC ...... *H01L 45/1608* (2013.01); *G11C 13/0004* (2013.01); *H01L 27/101* (2013.01); *H01L 27/24* (2013.01); *H01L 27/2409* (2013.01); *H01L 45/04* (2013.01); *H01L 45/06* (2013.01); *H01L 45/1233* (2013.01); *H01L 45/1253* (2013.01); *H01L 45/142* (2013.01);
(Continued)

(58) Field of Classification Search
  CPC ... H01L 45/06; H01L 45/144; H01L 45/1233; H01L 45/148; H01L 27/2463; H01L 45/1675; H01L 45/04; H01L 45/1641; H01L 45/126; G11C 13/0004
  USPC ...... 438/102, 242, 303, 597; 257/4, E45.002
  See application file for complete search history.

(56) References Cited

U.S. PATENT DOCUMENTS 5,923,587 A    7/1999  Choi
6,091,154 A    7/2000  Ohkawa
(Continued)

FOREIGN PATENT DOCUMENTS

CN    101803025 B    7/2014
EP    1696441 A1    8/2006
(Continued)

OTHER PUBLICATIONS

"Chinese Application Serial No. 200880107834.5, Office Action dated Mar. 22, 2012", w/English Translation, 10 pgs.
(Continued)

*Primary Examiner* — David Chen
(74) *Attorney, Agent, or Firm* — Schwegman Lundberg & Woessner, P.A.

(57) ABSTRACT

Variable-resistance material memories include a buried salicide word line disposed below a diode. Variable-resistance material memories include a metal spacer spaced apart and next to the diode. Processes include the formation of one of the buried salicide word line and the metal spacer. Devices include the variable-resistance material memories and one of the buried salicided word line and the spacer word line.

13 Claims, 16 Drawing Sheets

Related U.S. Application Data division of application No. 14/844,747, filed on Sep. 3, 2015, now Pat. No. 9,666,800, which is a division of application No. 11/857,682, filed on Sep. 19, 2007, now Pat. No. 9,129,845.

(51) Int. Cl.
  *H01L 27/24* (2006.01)
  *H01L 27/10* (2006.01)

(52) U.S. Cl.
  CPC .......... *H01L 45/143* (2013.01); *H01L 45/144* (2013.01); *G11C 2213/72* (2013.01)

(56) References Cited

U.S. PATENT DOCUMENTS

| | | | |
|---|---|---|---|
| 6,961,258 B2 | 11/2005 | Lowrey | |
| 6,992,365 B2 | 1/2006 | Xu et al. | |
| 7,002,837 B2 | 2/2006 | Morimoto | |
| 7,583,528 B2 | 9/2009 | Aoki | |
| 7,876,597 B2 | 1/2011 | Jun | |
| 8,355,273 B2 | 1/2013 | Liu | |
| 8,603,888 B2 | 12/2013 | Liu | |
| 9,129,845 B2 | 9/2015 | Liu et al. | |
| 9,666,800 B2 | 5/2017 | Liu et al. | |
| 10,090,464 B2 | 10/2018 | Liu et al. | |
| 2002/0097598 A1 | 7/2002 | Hoenigschmid | |
| 2004/0125646 A1 | 7/2004 | Durlam et al. | |
| 2004/0174732 A1 | 9/2004 | Morimoto | |
| 2005/0073001 A1 | 4/2005 | Kamigaichi et al. | |
| 2005/0248978 A1 | 11/2005 | Chen et al. | |
| 2005/0266634 A1 | 12/2005 | Park et al. | |
| 2006/0017088 A1 | 1/2006 | Abbott et al. | |
| 2006/0110877 A1 | 5/2006 | Park et al. | |
| 2006/0138467 A1 | 6/2006 | Lung | |
| 2006/0145240 A1 | 7/2006 | Park et al. | |
| 2006/0186483 A1 | 8/2006 | Cho et al. | |
| 2006/0231887 A1 | 10/2006 | Kim et al. | |
| 2006/0284237 A1 | 12/2006 | Park et al. | |
| 2006/0284268 A1 | 12/2006 | Matsunaga | |
| 2007/0069217 A1 | 3/2007 | Herner | |
| 2007/0105267 A1 | 5/2007 | Karpov et al. | |
| 2007/0111487 A1 | 5/2007 | Kim et al. | |
| 2007/0121369 A1 | 5/2007 | Happ | |
| 2007/0176252 A1 | 8/2007 | Coolbaugh et al. | |
| 2007/0190766 A1 | 8/2007 | Seo et al. | |
| 2008/0185571 A1 | 8/2008 | Happ et al. | |
| 2008/0315171 A1 | 12/2008 | Happ et al. | |
| 2008/0315172 A1 | 12/2008 | Happ et al. | |
| 2008/0315359 A1 | 12/2008 | Happ et al. | |
| 2009/0052230 A1 | 2/2009 | Rajendran et al. | |
| 2009/0072341 A1 | 3/2009 | Liu et al. | |
| 2009/0073741 A1 | 3/2009 | Liu | |
| 2011/0103129 A1 | 5/2011 | Liu | |
| 2013/0130469 A1 | 5/2013 | Liu | |
| 2015/0380647 A1 | 12/2015 | Liu et al. | |
| 2017/0263865 A1 | 9/2017 | Liu et al. | |
| 2019/0027685 A1 | 1/2019 | Liu et al. | |

FOREIGN PATENT DOCUMENTS

| | | | |
|---|---|---|---|
| EP | 2191509 B1 | 3/2013 | |
| JP | 11204742 A | 7/1999 | |
| JP | 00236078 A2 | 8/2000 | |
| JP | 2004319725 A | 11/2004 | |
| JP | 200592912 A | 4/2005 | |
| JP | 2006040981 A | 2/2006 | |
| JP | 2006514781 A | 5/2006 | |
| JP | 2006237605 A | 9/2006 | |
| JP | 2007005785 A | 1/2007 | |
| JP | 2007019559 A | 1/2007 | |
| JP | 2007226884 A | 9/2007 | |
| JP | 2007329480 A | 12/2007 | |
| JP | 2008078663 A | 4/2008 | |
| KR | 1020060042730 A | 5/2006 | |
| KR | 1020060133394 A | 12/2006 | |
| KR | 100692278 B1 | 3/2007 | |
| TW | 200425139 A | 11/2004 | |
| TW | 200506949 A | 2/2005 | |
| TW | 200520203 A | 6/2005 | |
| TW | 200703628 A | 1/2007 | |
| WO | WO-2008 1 4 94 9 | 12/2008 | |
| WO | WO-09038747 A2 | 3/2009 | |
| WO | WO-09038780 A2 | 3/2009 | |
| WO | WO-09038780 A3 | 3/2009 | |
| WO | WO-09038747 A3 | 6/2009 | |

OTHER PUBLICATIONS

"Chinese Application Serial No. 200880107834.5, Office Action dated Apr. 22, 2013", w/English Translation, 5 pgs.
"Chinese Application Serial No. 200880107834.5, Office Action dated Aug. 31, 2012", w/English Translation, 6 pgs.
"Chinese Application Serial No. 200880107834.5, Office Action dated Sep. 24, 2013", w/English Translation, 4 pgs.
"Chinese Application Serial No. 200880107834.5, Office Action dated Oct. 24, 2011", w/English Translation, 7 pgs.
"Chinese Application Serial No. 200880107834.5, Response filed Jan. 9, 2013 to Office Action dated Aug. 31, 2012", w/English Claims.
"Chinese Application Serial No. 200880107834.5, Response filed Feb. 26, 2012 to Office Action dated Oct. 24, 2011", w/English Claims, 14 pgs.
"Chinese Application Serial No. 200880107834.5, Response filed Jun. 25, 2013 to Office Action dated Apr. 22, 2013", w/English Claims, 12 pgs.
"Chinese Application Serial No. 200880107834.5, Response filed Dec. 6, 2013 to Office Action dated Sep. 24, 2013", w/English Translation, 5 pgs.
"Chinese Application Serial No. 200880107834.5, Response filed Aug. 3, 2012 to Office Action dated Mar. 22, 2012", w/English Claims, 13 pgs.
"European Application Serial No. 08832147.6, Response to Extended European Search report filed May 25, 2012", 7 Pgs.
"European Application Serial No. 08832147.6, Supplemental Search Report dated Nov. 8, 2011", 5 pgs.
"International Application Serial No. PCT/US2008/010870 Search Report and Writen Opinion dated Apr. 21, 2009", 12 pgs.
"International application serial No. PCT/US2008/010870 Written Opinion dated Apr. 21, 2009", 8 pgs.
"International Application Serial No. PCT/US2008/010925 Search Report and Written Opinion dated Apr. 21, 2009", 11 pgs.
"Japanese Application Serial No. 2010-525828 Response filed Nov. 17, 2014 to Office Action dated Sep. 9, 2014", w/English Translation, 13 pgs.
"Japanese Application Serial No. 2010-525828, ExaminersDecision of Final Refusal dated Mar. 25, 2014", w/English Translation, 5 pgs.
"Japanese Application Serial No. 2010-525828, Office Action dated Jul. 23, 2013", w/English Translation, 11 pgs.
"Japanese Application Serial No. 2010-525828, Office Action dated Sep. 9, 2014", w/English Translation, 2 pgs.
"Japanese Application Serial No. 2010-525828, Response filed Nov. 12, 2013 to Office Action dated Jul. 23, 2013", w/English Claims, 29 pgs.
"Korean Application Serial No. 10-2010-7008373, Office Action dated Nov. 21, 2014", w/English Translation, 11 pgs.
"Korean Application Serial No. 10-2010-7008510, Amendment filed Sep. 23, 2013", w/English Claims, 52 pgs.
"Korean Application Serial No. 10-2010-7008510, Office Action dated Oct. 21, 2013", w/English Claims, 9 pgs.
"Taiwanese Application Serial No. 097136210, Office Action dated Mar. 23, 2012",w/English Translation, 10 pgs.
Beckett, Paul, "Towardsa Reconfigurable Nanocomputer Platform", Proc. of the 7th Asia-Pacific Computer SystemsArchitecturesConference(ACSAC).Melbourne,Australia: ACS, (Jan. 2002), 1-8.

(56) References Cited

OTHER PUBLICATIONS

Cho, Woo Yeong, et al., "A 0.18-μm 3.0-V 64-Mb Nonvolatile Phase-Transition Random Access Memory(PRAM)", IEEE Journal of Solid-State Circuits, 40(1), (Jan. 2005), 293-300.
Hwang, Y. N., "Phase-change chalcogenide nonvolatile RAM completely based on CMOS technology", IEEE 2003 International Symposium on VLSITechnology, Systems, and Applications, (2003), 29-31.
Matsuzaki, N., et al., "Oxygen-doped gesbte phase-change memory cells featuring 1.5 V/100-/spl mu/A standard 0.13/spl mu/m CMOS operations", IEEE International Electron DevicesMeeting, 2005. IEDM Technical Digest., (2005), 738-741.
Oh, J. H., et al., "Full Integration of Highly Manufacturable 512Mb PRAM based on 90nm Technology", IEEE International Electron DevicesMeeting, 2006. IEDM '06., (2006), 1-4.

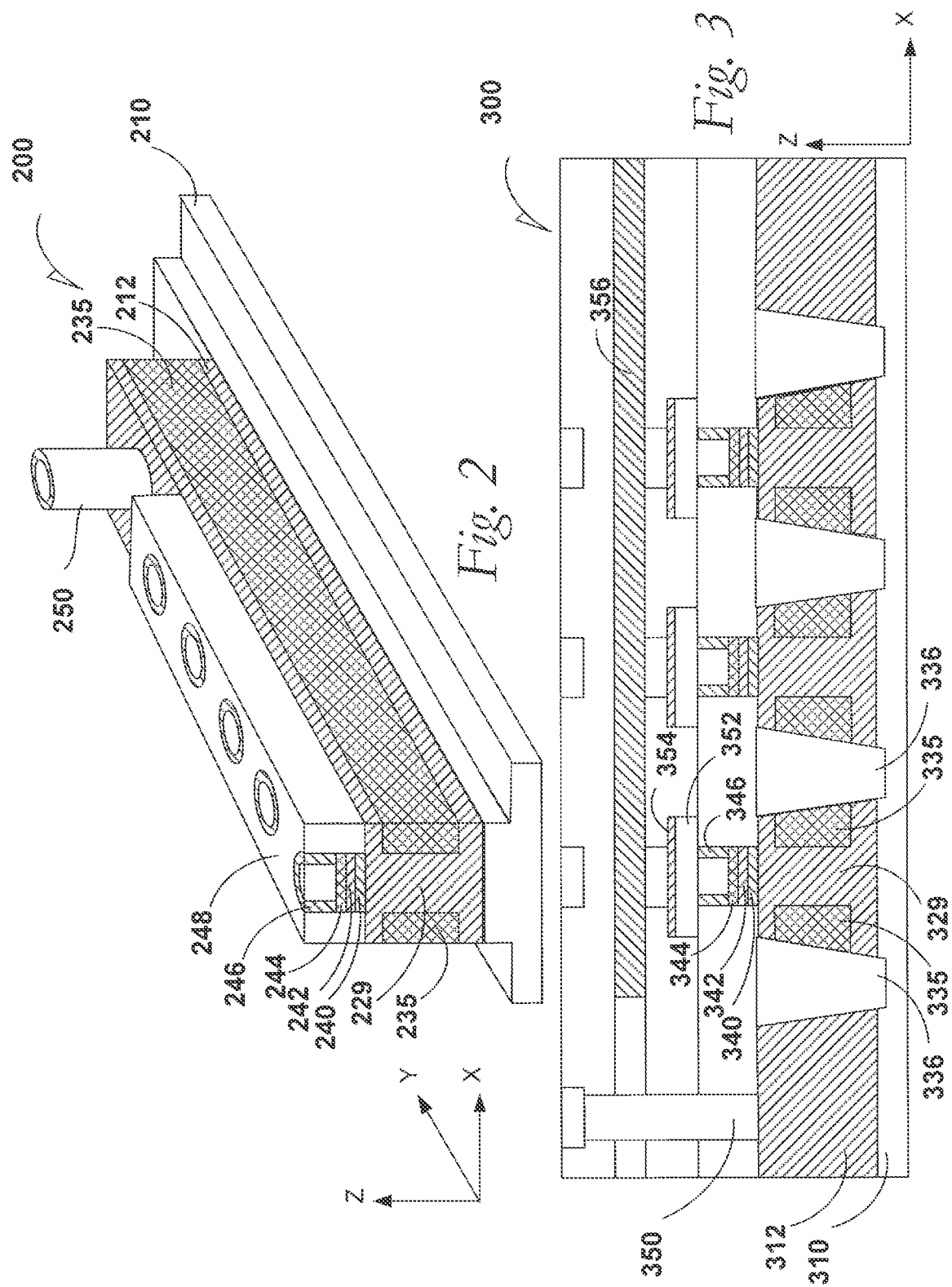

BURIED LOW-RESISTANCE METAL WORD LINES FOR CROSS-POINT VARIABLE-RESISTANCE MATERIAL MEMORIES

PRIORITY APPLICATION

This application is a divisional of U.S. application Ser. No. 15/606,624, filed May 26, 2017, which is a divisional of U.S. application Ser. No. 14/844,747, filed Sep. 3, 2015, which is a divisional of U.S. application Ser. No. 11/857,682, filed Sep. 19, 2007, now issued as U.S. Pat. No. 9,129,845, each of which is incorporated herein by reference in its entirety.

TECHNICAL FIELD

This disclosure relates generally to variable-resistance material random-access memories.

BACKGROUND

Variable-resistance material memory structures often rely upon heavily doped semiconductive leads that serve as the word line in a cross-point variable-resistance material random-access memory. A significant parasitic resistance drop may occur in such a word line due to the programming current used in a variable-resistance material random-access memory. Backend metal line strapping therefore can be applied to reduce word line resistance. This metal line strapping can also cause further complications in memory cell size and in processing complexity.

What are needed are methods to form better structures that can address these challenges. Also needed are improved variable-resistance material random-access memory structures that can also address these challenges.

BRIEF DESCRIPTION OF THE DRAWINGS

Disclosed embodiments are addressed by the present disclosure and will be understood by reading and studying the following specification, of which the figures are a part.

FIG. 2 shows a perspective elevation of a variable-resistance material memory device according to an embodiment;

FIG. 3 shows a cross-section elevation of a variable-resistance material memory device according to an embodiment;

DETAILED DESCRIPTION

The embodiments of a device, an apparatus, or an article described herein can be manufactured, used, or shipped in a number of positions and orientations. A variable-resistance material memory device may include a material such as an alloy. A variable-resistance material memory device may include a material such as a quasi-metal composition. A variable-resistance material memory device may include a material such as metal oxides. A variable-resistance material memory device may include a material such as chalcogenides. These several materials can be very diverse in quality and performance.

Figure 1A:
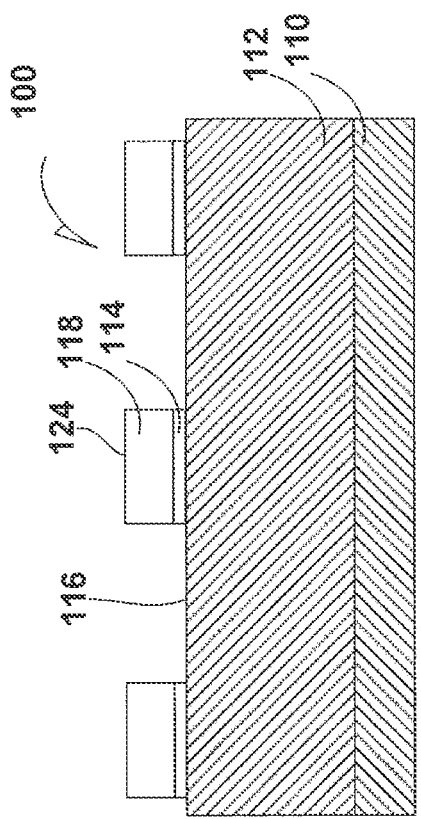
FIGS. 1a-1h and 1j-1k show cross-section elevations of a semiconductor device during processing according to an embodiment.

FIG. 1a shows a cross-section elevation of a semiconductor device 100 during processing according to an embodiment. A semiconductive lower substrate 110 has been formed below a semiconductive upper substrate 112. In an embodiment, the semiconductive lower substrate 110 is P− doped in comparison to the semiconductive upper substrate 112 that is N+ doped.

A dielectric film 114 such as silicon dioxide is formed upon the upper surface 116 of the semiconductive upper substrate 112. A first hard mask 118 is disposed above the dielectric film 114, and the hard mask 118 and the dielectric film 114 have been patterned to expose the upper surface 116. The first hard mask includes a vertically exposed surface 124. In an embodiment, the first hard mask 118 is a nitride material like silicon nitride such as $Si_3N_4$.

Figure 1B:
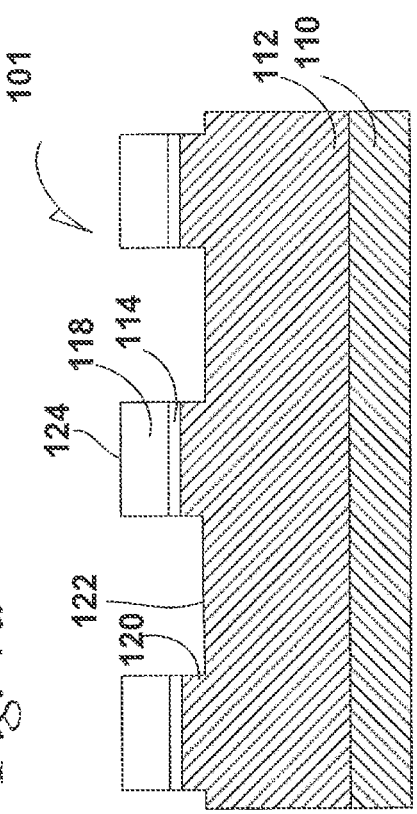

FIG. 1b shows a cross-section elevation of the semiconductor device depicted in FIG. 1a after further processing according to an embodiment. The semiconductor device 101 has been etched through the upper surface 116 (FIG. 1a) to form a first recess 120 including a first recess bottom 122. The first hard mask 118 also exhibits the vertically exposed surface 124 that facilitates a directional etch into the semiconductive upper substrate 112.

Figure 1C:
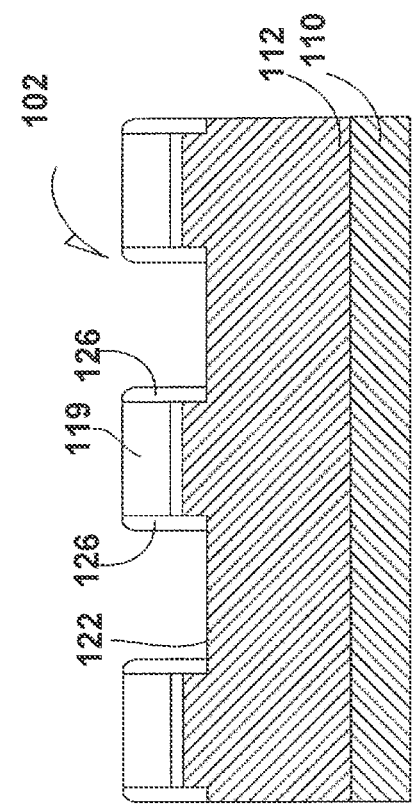

FIG. 1c shows a cross-section elevation of the semiconductor device depicted in FIG. 1b after further processing according to an embodiment. The semiconductor device 102 has been processed to form a first recess 120 including a first recess bottom 122. A first spacer 126 has been formed by blanket deposition and a spacer etch. In an embodiment, the first spacer 126 and the first hard mask 118 are nitride materials, and the spacer etch, although it is selective to etching nitride materials, removes the nitride material upon the first recess bottom 122 as well as upon the vertically exposed surfaces 124 of the first hard mask 118. Consequently in an embodiment as depicted in FIG. 1c, the first hard mask 118 (FIG. 1b) may be slightly height-reduced to become the first hard mask 119.

Figure 1D:
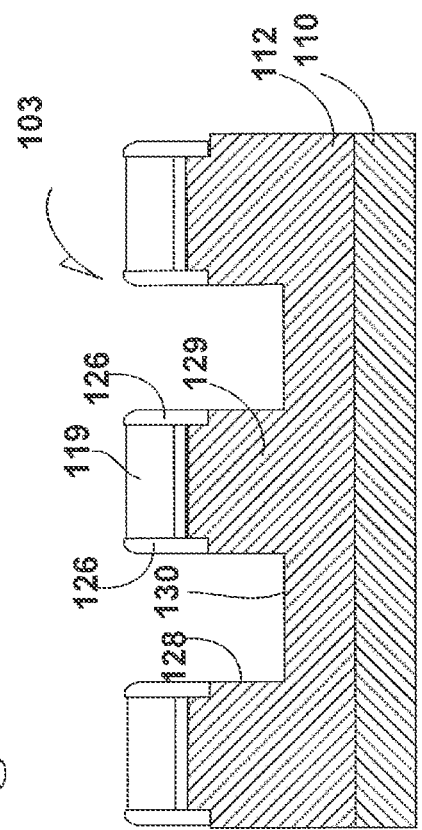

FIG. 1d shows a cross-section elevation of the semiconductor device depicted in FIG. 1c after further processing according to an embodiment. The semiconductor device 103 has been etched through the first recess bottom 122 (FIG. 1c) to form a second recess 128, a pillar 129 of some of the semiconductive upper substrate 112, and a second recess bottom 130 in some of the semiconductive upper substrate 112.

Figure 1E:
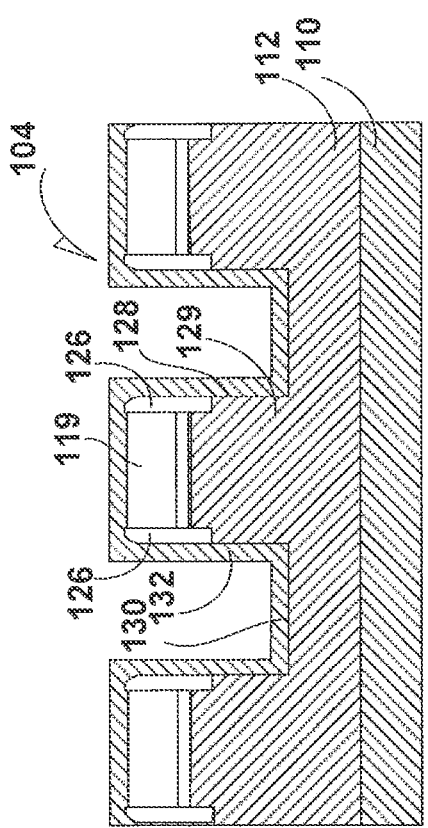

FIG. 1e shows a cross-section elevation of the semiconductor device depicted in FIG. 1d after further processing according to an embodiment. The semiconductor device 104 has been blanket deposited with a first metal 132. The first metal 132 is used to form a silicide in the semiconductive upper substrate 112.

Figure 1F:
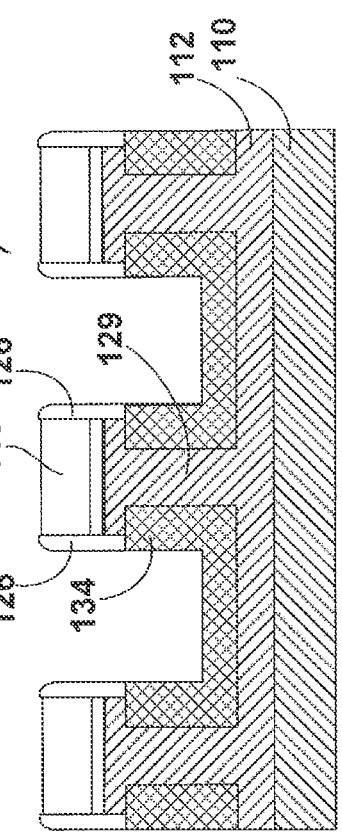

FIG. 1f shows a cross-section elevation of the semiconductor device depicted in FIG. 1e after further processing according to an embodiment. The semiconductor device 105 has been processed under conditions to cause salicidation (self-aligned silicidation) of the first metal 132 into the semiconductive upper substrate 112 including into the pillar 129 that is part of the semiconductive upper substrate 112. A salicide structure 134 is formed by this process. In an embodiment, the first metal 132 is cobalt (Co), and the process has allowed the salicide structure 134 to form as cobalt silicide ($CoSi_2$) material. Further, both the sidewalls of the second recess 128 and the second recess bottom 130 have been consumed and transformed into the salicide structure 134. After salicidation, any excess first metal 132 is removed with a stripping procedure that is selective to leaving the salicide structure 134 as well as the first hard mask 119 and the first spacer 126.

Figure 1G:
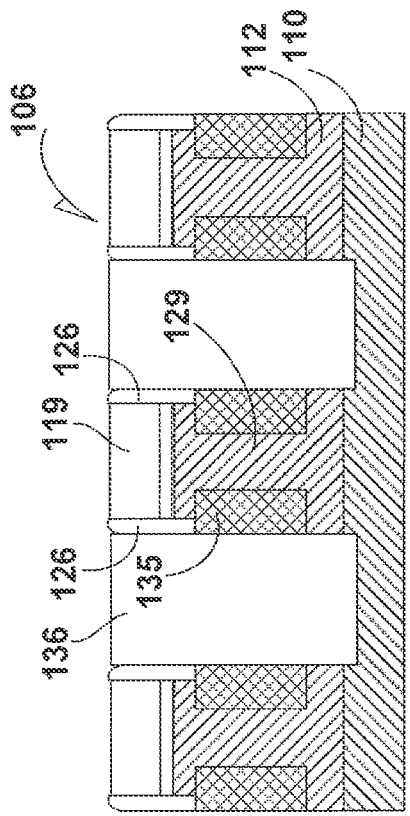

FIG. 1g shows a cross-section elevation of the semiconductor device depicted in FIG. 1f after further processing according to an embodiment. The semiconductor device 106 has been processed with a shallow-trench isolation (STI) 136. Before formation of the STI 136, a third etch has been carried out that penetrates the salicide structure 134 (FIG. 1f) to form a buried salicide word line 135 in the pillar 129. The third etch further penetrates the semiconductive upper substrate 112, and that may further penetrate into the semiconductive lower substrate 110. Consequently, a given STI 136 effectively isolates neighboring buried salicide word lines 135. The STI 136 may be processed by a blanket deposition, followed by an etchback or a chemical-mechanical polishing that stops on the first hard mask 119.

Figure 1H:
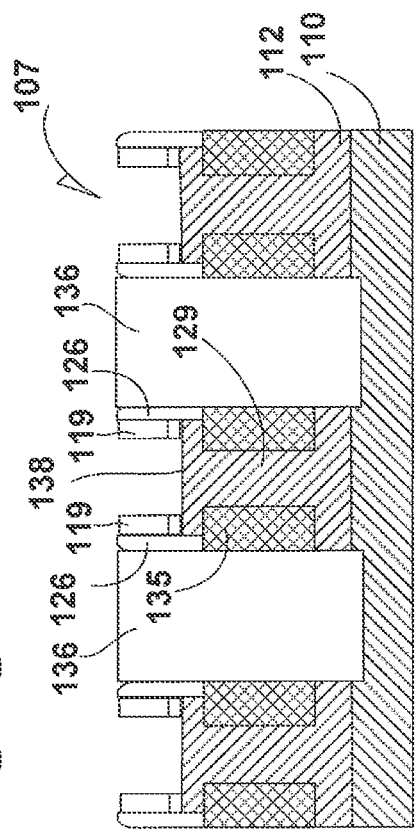

FIG. 1h shows a cross-section elevation of the semiconductor device depicted in FIG. 1g after further processing according to an embodiment. The semiconductor device 107 has been processed with a fourth etch that has penetrated the first hard mask 119 and that exposes the pillar 129 at a pillar upper surface 138. The fourth etch includes an etch recipe that is selective to leaving the semiconductive material of the semiconductive upper substrate 112, particularly at the pillar 129.

Figure 1J:
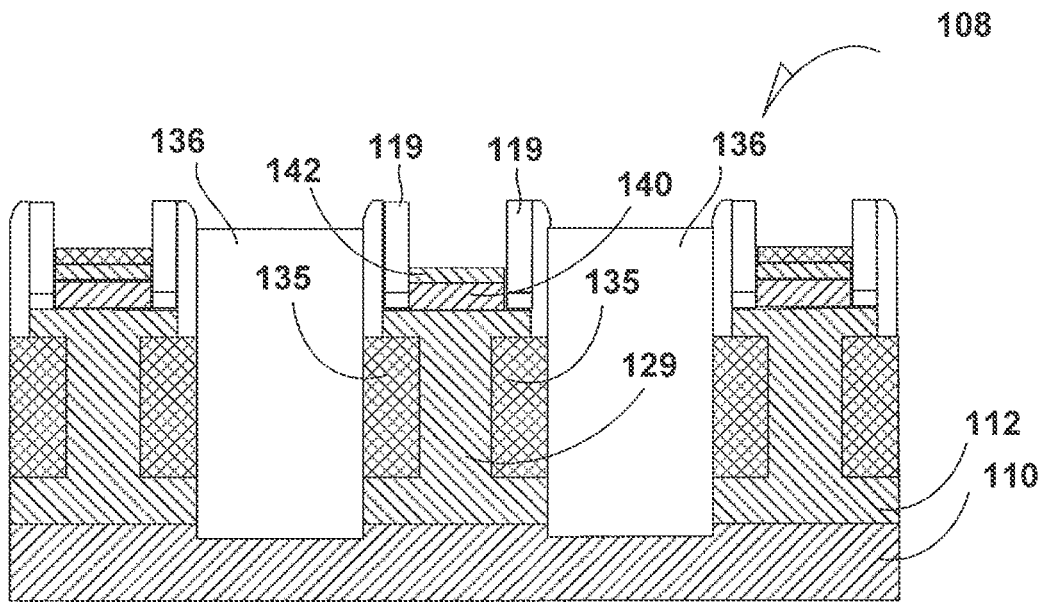

FIG. 1j shows a cross-section elevation of the semiconductor device depicted in FIG. 1h after further processing according to an embodiment. The semiconductor device 108 has been processed by growing an epitaxial first film 140 upon the pillar 129 at the pillar upper surface 138 (FIG. 1h). In an embodiment where the pillar 129 is an N+ silicon, the epitaxial first film 140 is an N− silicon. In an embodiment, formation of the epitaxial first film 140 is carried out by in situ N− doping during epitaxial growth. In an embodiment, formation of the epitaxial first film 140 is carried out by epitaxial growth, followed by light N− doping thereof. In an embodiment, the epitaxial first film 140 fills the via over the pillar upper surface 138 (FIG. 1h) and then is planarized by etchback or by polishing. In an embodiment, a counter-doped second film 142 is formed by P+ implantation into the surface of the epitaxial first film 140 by counter-doping.

After formation of the epitaxial first film 140, a diode 140, 142 is configured. In an embodiment, the diode 140, 142 is formed by growing an epitaxial second film 142 above and on the epitaxial first film 140.

In an embodiment where the epitaxial first film 140 is an N− silicon, the epitaxial second film 142 is a P+ silicon. In an embodiment, formation of the epitaxial second film 142 is carried out by in situ P+ doping during epitaxial growth. In an embodiment, formation of the epitaxial second film 142 is carried out by epitaxial growth, followed by heavy P+ doping thereof.

Hereinafter, both the epitaxial second film 142 and counterdoped second film 142 will be referred to as the second film 142 unless otherwise explicitly stated.

Figure 1K:
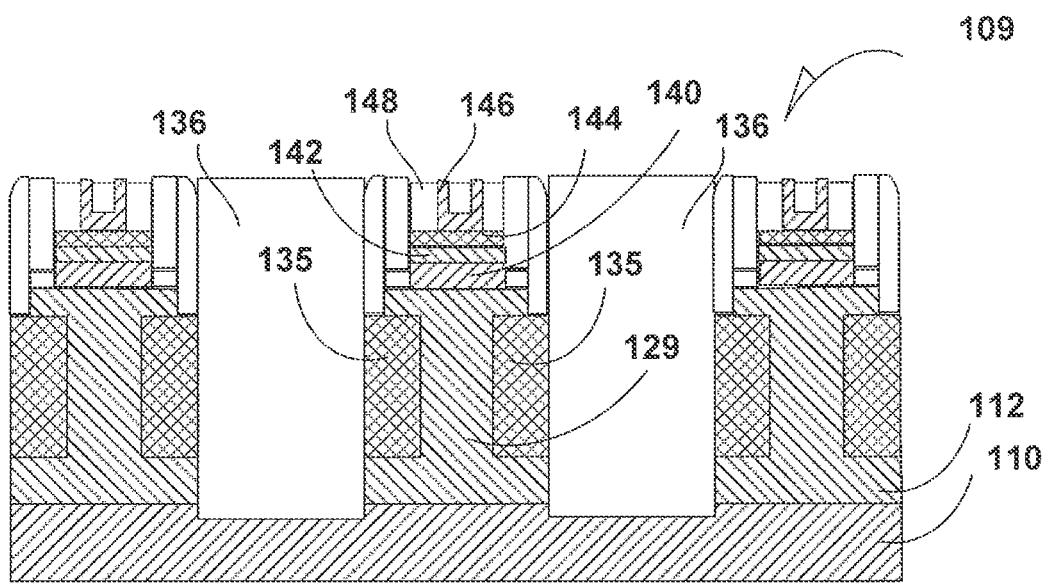

FIG. 1k shows a cross-section elevation of the semiconductor device depicted in FIG. 1j after further processing according to an embodiment. The semiconductor device 109 has been processed to form a silicide contact 144. After formation of the diode 140, 142 (FIG. 1j), silicidation of a portion of the second film 142 is carried out. In an embodiment, a cobalt film is deposited over the second film 142 and thermal conversion of a portion of the P+ second film 142 is carried out. Consequently, the diode structure is altered and takes the form of the epitaxial first film 140, and an altered second film 142.

Salicidation has formed the silicide contact 144 above the second film 142.

Further processing includes the formation of a bottom electrode 146 in a dielectric film 148 such as a silicon oxide film or a silicon nitride film. The bottom electrode 146 is depicted as making contact with the silicide contact 144, and is illustrated as an open-ended cylinder. Other types of bottom electrodes can be implemented such as plug bottom electrodes, liner electrodes, and others.

FIG. 2 shows a perspective elevation of a phase-change memory device 200 according to an embodiment. A pillar 229 that has been formed from a semiconductive upper substrate 212, which rests upon semiconductive lower substrate 210. A buried salicide word line 235 is disposed in the pillar 229, and a diode 240, 242 made of two different semiconductive materials is disposed upon the pillar 229. A silicide contact 244 is disposed upon the second film 242 that is part of the diode 240, 242. A bottom electrode 246 is disposed in a dielectric film 248 such as a silicon oxide film or a silicon nitride film. The bottom electrode 246 is depicted as making contact with the silicide contact 244 and is illustrated as an open-ended cylinder.

A word line strap 250 is depicted as penetrating the pillar 229. Although not depicted, the pillar 229 is isolated from adjacent and spaced-apart pillars by STI structures.

FIG. 3 shows a cross-section elevation of a phase-change memory device 300 according to an embodiment. A pillar 329 that has been formed from a semiconductive upper substrate 312 rests upon semiconductive lower substrate 310. In an embodiment, the pillar is made of an N+ doped silicon, and the semiconductive lower substrate 310 is made of a P-doped silicon.

A buried salicide word line 335 is disposed in the pillar 329, and a diode 340, 342 made of two different semiconductive materials is disposed upon the pillar 329. In an embodiment, the diode 340, 342 is made of an N− doped epitaxial first film 340, and a partially consumed P+ doped second film 342.

A silicide contact 344 is disposed upon the second film 342 that is part of the diode 340, 342. A bottom electrode 346 is disposed in a dielectric film such as a silicon oxide film. In an embodiment, the bottom electrode 346 is a conductor such as titanium nitride, titanium aluminum nitride, titanium nickel tin, tantalum nitride, tantalum silicon nitride, and others. The bottom electrode 346 is depicted as making contact with the silicide contact 344.

The bottom electrode 346 contacts a variable-resistance material 352. In an embodiment, variable-resistance material 352 is a phase-change material such as a chalcogenide material.

In an embodiment, the variable-resistance material that may be used as a phase-change random-access memory (PCRAM) cell is a gallium (Ga) containing material. Selected gallium-containing materials that may be used include GaSb, Ga—Ge—Sb, Ga—Se—Te, and others. In some gallium-containing phase-change material embodiments, the gallium is present in a majority amount (greater than or equal to 50 percent). In some gallium-containing phase-change material embodiments, the gallium is present in a plurality amount (gallium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a germanium (Ge) containing material. Selected germanium-containing materials that may be used include Ge—Te, Ge—Sb—Te, Ge—Te—As, Ge—Se—Ga, Ge—In—Sb, Ge—Te—Sb—S, Ge—Te-Sn_o, Ge—Te—Sn_Au, Ge—Pd—Te—Sn, Ge—Sb—Te—Pd, Ge—Sb—Te—Co, Ge—Sb—Se—Te, Ge—Sn—Te, Ge—Te—Sn—Ni, Ge—Te—Sn—Pd, Ge—Te—Sn—Pt. and others. In some germanium-containing phase-change material embodiments, the germanium is present in a majority amount (greater than or equal to 50 percent). In some germanium-containing phase-change material embodiments, the germanium is present in a plurality amount (germanium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an indium (In) containing material. Selected indium-containing materials that may be used include In—Se, In—Sb, In—Sb—Te, In—Sb—Ge, In—Se—Ti—Co, In—Ag—Sb—Te, and others. In some indium-containing phase-change material embodiments, the indium is present in a majority amount (greater than or equal to 50 percent). In some indium-containing phase-change material embodiments, the indium is present in a plurality amount (indium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an antimony (Sb) containing material. Selected antimony-containing materials that may be used include $Sb_2Te_3$, Sb—Ga, Sb—Bi—Se, Sb—Sn—Te, Sb—In—Ge, Sb—Te—Ge—S, Sb—Ge—Te—Pd, Sb—Ge—Te—Co, Sb—Te—Bi—Se, Sb—Ag—In—Te, Sb—Ge, Sb—Ge—Se—Te, Sb—Ge—Sn—Te, and others. In some antimony-containing phase-change material embodiments, the antimony is present in a majority amount (greater than or equal to 50 percent). In some antimony-containing phase-change material embodiments, the antimony is present in a plurality amount (antimony being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a tellurium (Te) containing material. Selected tellurium-containing materials that may be used include Te—Ge, Te—Sb, Te—As, Te—Al, Te—Ge—Sb, Te—Ge—As, Te—In—Sb, Te—Sn—Se, Te—Ga—Se, Te—Sn—Sb, Te—Ge—Sb—S, Te—Ge—Sn—O, Te—Ge—Sn—Au, Te—Pd—Ge—Sn, Te—Ge—Sb—Pd, Te—Ge—Sb—Co, Te—Sb—Bi—Se, Te—Ag—In—Sb, Te—Ge-Ab-Se, Te—Ge—Sn—Sb, Te—Ge—Sn—Ni, Te—Ge—Sn—Pd, Te—Ge—Pd—Pt and others. In some tellurium-containing phase-change material embodiments, the tellurium is present in a majority amount (greater than or equal to 50 percent). In some tellurium-containing phase-change material embodiments, the tellurium is present in a plurality amount (tellurium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a selenium (Se) containing material. Selected selenium-containing materials that may be used include Se—In, Se—Te—Sn, Se—Ge—Ga, Se—Bi—Sb, Se—Ga—Te, Se—In—Ti—Co, Se—Sb—Te—Bi, Se—Ge—Sb—Te, and others. In some selenium-containing phase-change material embodiments, the selenium is present in a majority amount (greater than or equal to 50 percent). In some selenium-containing phase-change material embodiments, the selenium is present in a plurality amount (selenium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an arsenic (As) containing material. Selected arsenic-containing materials that may be used include As—Te, As—Te—Ge, and others. In some arsenic-containing phase-change material embodiments, the arsenic is present in a majority amount (greater than or equal to 50 percent). In some arsenic-containing phase-change material embodiments, the arsenic is present in a plurality amount (arsenic being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an aluminum (Al) containing material. Selected aluminum-containing materials that may be used include Al—Te, Al—Se and others. In some aluminum-containing phase-change material embodiments, the aluminum is in a majority amount.

In an embodiment, the variable-resistance material that may be used as a PCRAM cell is a tin (Sn) containing material. Selected tin-containing materials that may be used include Sn—Te—Se, Sn—Sb—Te, Sn—Te—Ge—O, Sn—Pd—Te—Ge, Sn—Ge—Sb—Te, Sn—Ge—Sb—Te, Sn—Ge—Te—Ni, Sn—Ge—Te—Pd, Sn—Ge—Te—Pt, and others. In some tin-containing phase-change material embodiments, the tin is present in a majority amount (greater than or equal to 50 percent). In some tin-containing phase-change material embodiments, the tin is present in a plurality amount (tin being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a palladium (Pd) containing material. Selected palladium-containing materials that may be used include Pd—Te—Ge—Sn, Pd—Ge—Sb—Te, and others. In some palladium-containing phase-change material embodiments, the palladium is present in a majority amount (greater than or equal to 50 percent). In some palladium-containing phase-change material embodiments, the palladium is present in a plurality amount (palladium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a silver (Ag) containing material. Selected silver-containing materials that may be used include Ag—In—Sb—Te, and others. In some silver-containing phase-change material embodiments, the silver is present in a majority amount (greater than or equal to 50 percent). In some silver-containing phase-change material embodiments, the silver is present in a plurality amount (silver being the most prevalent element). In some embodiments, the first-listed element is present in either a majority or plurality amount, and the subsequent-listed elements are listed by order of decreasing amounts on an elemental scale.

In an embodiment, the variable resistance material 352 may include one of various materials used to form so-called "colossal magnetoresistive films" such as, for example, $Pr_{(1-x)}Ca_xMnO_3$ (PCMO), $La_{(1-x)}Ca_xMnO_3$ (LCMO), and $Ba_{(1-x)}Sr_xTiO_3$.

In an embodiment, the variable resistance material 352 may include a binary or ternary doped or undoped oxide material such as, for example, $Al_2O_3$, $BaTiO_3$, $SrTiO_3$, $Nb_2O_5$, $SrZrO$, $TiO_2$, $Ta_2O_5$, $NiO$, $ZrO_x$, $HfO_x$, and $Cu_2O$.

In an embodiment, the variable resistance material 352 may have a Perovskite structure.

In an embodiment, the variable resistance material 352 includes a doped chalcogenide glass of the general formula $A_xB_y$, where B is selected from sulfur (S), selenium (Se), and tellurium (Te), and mixtures thereof, and where A includes at least one element from Group III-A (B, Al, Ga, In, Ti), Group IV-A (C, Si, Ge, Sn, Pb), Group V-A (N, P, As, Sb, Bi), or Group VII-A (F, Cl, Br, I, At) with one or more dopants selected from noble metal and transition metal elements such as, for example, Au, Ag, Pt, Cu, Cd, In, Ru, Co, Cr, Ni, Mn, and Mo.

A word line strap 350 is depicted as penetrating the flanged part of the pillar 329. The pillar 329 is isolated from adjacent and spaced-apart pillars by STI structures 336. The STI structures 336 are depicted as tapered, which form may occur under various etching processes.

In an embodiment, the variable resistance material memory device 300 is a phase-change memory device 300. The pillar 329 that has been formed from the semiconductive upper substrate 312, rests upon the semiconductive lower substrate 310. In an embodiment, the pillar 329 is made of an N+ doped silicon, and the semiconductive lower substrate 310 is made of a P− doped silicon.

The buried salicide word line 335 is disposed in the pillar 329, and the diode 340, 342 is made of two different semiconductive materials. In an embodiment, the diode 340, 342 is made of an N− doped epitaxial first film 340 and a partially consumed P+ doped second film 342.

The silicide contact 344 is disposed upon the second film 342 that is part of the diode 340, 342. The bottom electrode 346 is disposed in a dielectric film such as a silicon oxide film or a silicon nitride film. In an embodiment, the bottom electrode 346 is a conductor such as titanium nitride, titanium aluminum nitride, titanium nickel tin, tantalum nitride, tantalum silicon nitride, and others. The bottom electrode 346 is depicted as making contact with the silicide contact 344.

The bottom electrode 346 contacts the variable-resistance material 352. In an embodiment, variable-resistance material 352 is a phase-change material such as a chalcogenide material. The variable-resistance material 352 is contacted from above by a top electrode 354. A bit line 356 is coupled to the top electrode 354.

Figure 4:
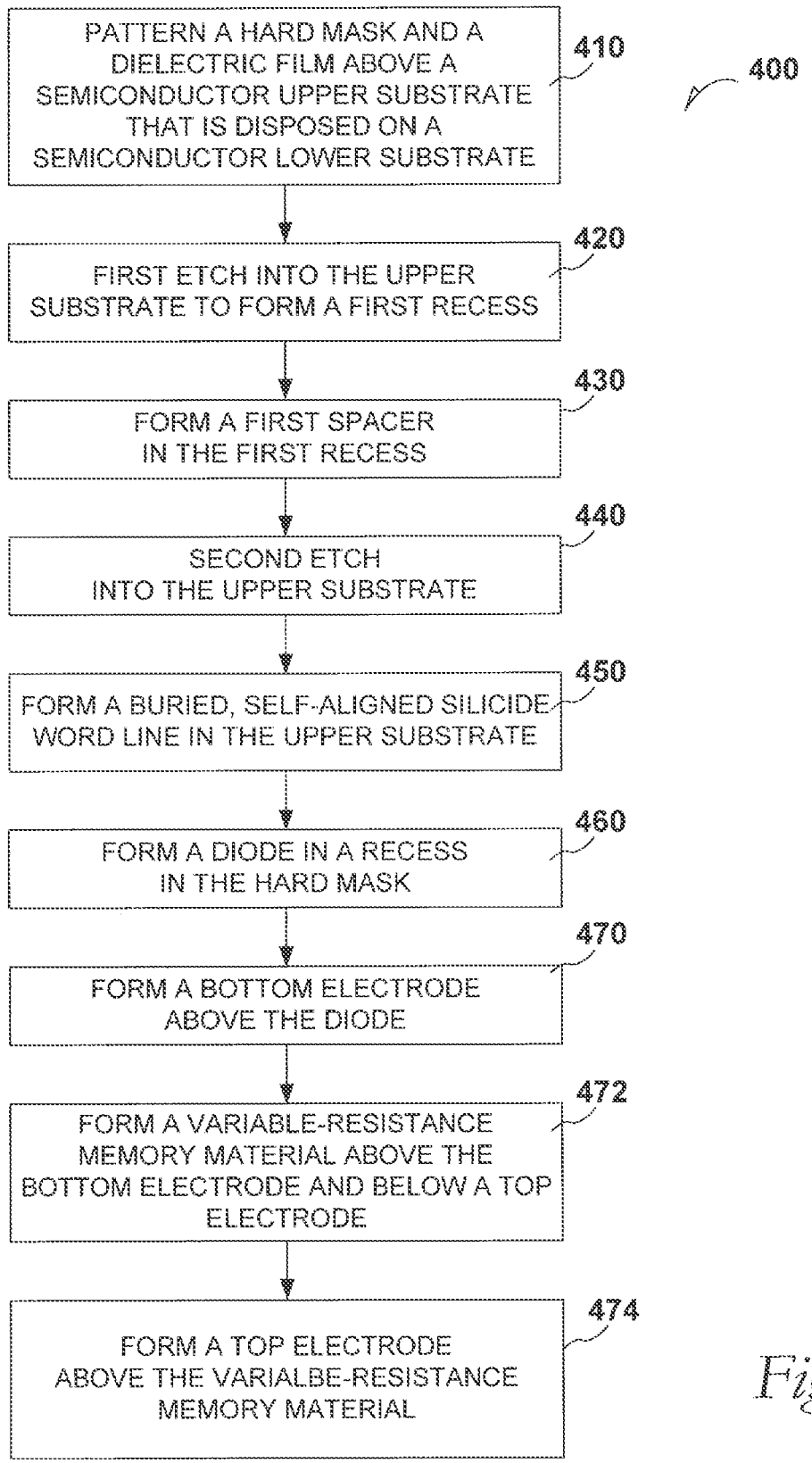
FIG. 4 shows a process flow for fabricating the structures depicted in FIGS. 1a through 3 according to an embodiment.

FIG. 4 is a process flow 400 diagram for fabricating a variable-resistance material memory device according to an embodiment. The process flow 400 may illustrate fabrication technique embodiments for making the structures depicted in FIGS. 1, 2, and 3.

At 410, a hard mask and dielectric film are patterned above a semiconductive upper substrate that is disposed on a semiconductive lower substrate.

At 420, a first etch penetrates into the upper surface to form a first recess with a first recess bottom in the semiconductive upper substrate.

At 430, the process includes forming a first spacer that fills into the first recess but that leaves the first recess bottom uncovered after a spacer etch.

At 440, the process includes a second etch that penetrates deeper into the semiconductive upper substrate.

At 450, the process includes forming a buried, self-aligned, silicide word line in the semiconductive upper substrate. In a non-limiting example, the buried salicide word line is formed as depicted in FIGS. 1e, 1f, and 1g.

At 460, the process includes forming a diode in a recess in the hard mask that exposes previously protected semiconductive upper substrate material. In a non-limiting example, the diode is formed as illustrated in FIGS. 1h, and 1j.

At 470, the process includes forming a bottom electrode above the diode.

At 472, the process includes forming a variable-resistance material memory above the bottom diode.

At 474, the process includes forming a top electrode above the variable-resistance material memory.

In an embodiment, the epitaxial first film 140 fills the via over the pillar upper surface 138 (FIG. 1h) and then is planarized by etchback or by polishing. In an embodiment, a counter-doped second film 142 is formed by P+ implantation into the surface of the epitaxial first film 140 by counter-doping.

Figure 5A:
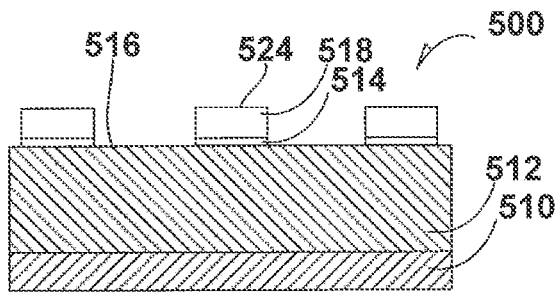
FIGS. 5a-5h and 5j-5k show cross-section elevations of a semiconductor device during processing according to an embodiment.

FIGS. 5a to 5k show cross-section elevations of a semiconductor device during processing according to an embodiment. In FIG. 5a, a cross-section elevation of a semiconductor device 500 is depicted during processing. A semiconductive lower substrate 510 has been formed below a semiconductive upper substrate 512. In an embodiment, the semiconductive lower substrate 510 is P-doped in comparison to the semiconductive upper substrate 512 that is N+ doped.

A dielectric film 514 such as silicon dioxide is formed upon the upper surface 516 of the semiconductive upper substrate 512. A first hard mask 518 is disposed above the dielectric film 514, and the hard mask 518 and the dielectric film 514 have been patterned to expose the upper surface 516. In an embodiment, the first hard mask 518 is a nitride material like silicon nitride such as $Si_3N_4$.

Figure 5B:
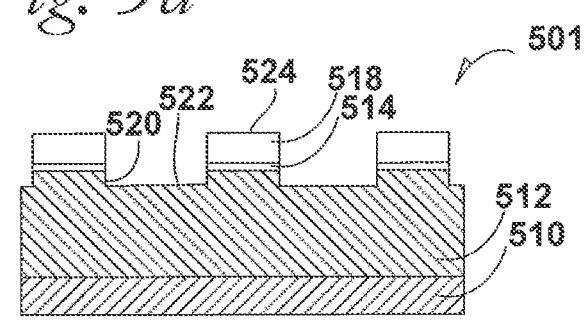

FIG. 5b shows a cross-section elevation of the semiconductor device depicted in FIG. 5a after further processing according to an embodiment. The semiconductor device 501 has been etched through the upper surface 516 (FIG. 1a) to form a first recess 520 including a first recess bottom 522. The first hard mask 518 also exhibits a vertically exposed surface 524 that facilitates a directional etch into the semiconductive upper substrate 512.

Figure 5C:
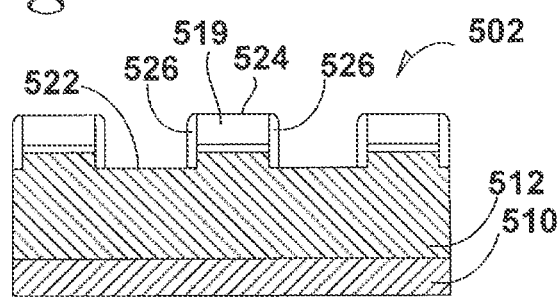

FIG. 5c shows a cross-section elevation of the semiconductor device depicted in FIG. 1b after further processing according to an embodiment. The semiconductor device 502 has been processed to form a first spacer 526 on the first hard mask 518. The first spacer 526 has been formed by blanket deposition and a spacer etch. In an embodiment, the first spacer 526 and the first hard mask 518 are nitride materials, and the spacer etch, although it is selective to etching nitride materials, removes the nitride material upon the first recess bottom 522 as well as upon the vertically exposed surfaces 524 of the first hard mask 518. Consequently, in an embodiment as depicted in FIG. 5c, the first hard mask 518 (FIG. 1b) may be slightly height-reduced to become the first hard mask 519.

Figure 5D:
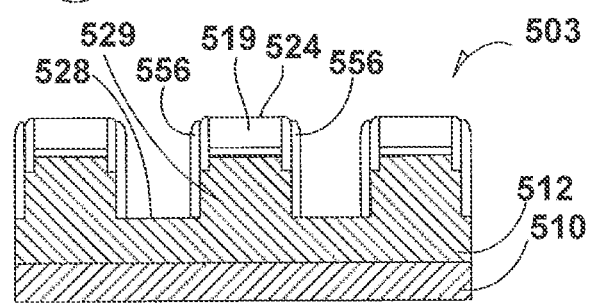

FIG. 5d shows a cross-section elevation of the semiconductor device depicted in FIG. 5c after further processing according to an embodiment. The semiconductor device 503 has been etched through the first recess bottom 522 (FIG. 5c) to form a second recess 528, a pillar 529 of some of the semiconductive upper substrate 512, and a second recess bottom in some of the semiconductive upper substrate 512. A second spacer 556 is formed on the first spacer 526 and the first hard mask 519. In an embodiment, the second spacer 556 is a nitride material. In an embodiment the second spacer 556 is a nitride material that has a different composition than the first spacer 526 and the hard mask 519, both of which may also be nitride materials.

Figure 5E:
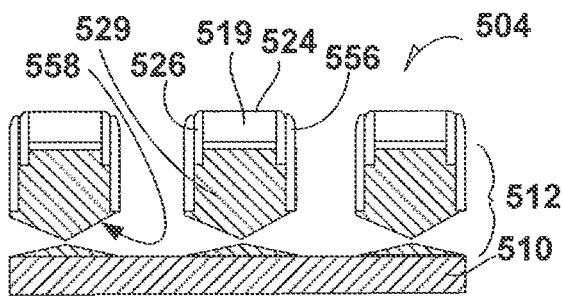

FIG. 5e shows a cross-section elevation of the semiconductor device depicted in FIG. 5d after further processing according to an embodiment. The semiconductor device 504 has been blanket isotropically or anisotropically etched such that an undercut 558 has formed below the first hard mask 519, the first spacer 526, and the second spacer 556. Accordingly, a pillar 529 has been formed of a part of the semiconductive upper substrate 512.

Etching may be wet, such as an isotropic HNA etch, which includes hydrofluoric acid (HF), nitric acid ($HNO_3$), and acetic acid ($CH_3OOH$). In an embodiment, an isotropic etch includes an ammonia fluoride-nitric acid ($NH_4F/HNO_3$) silicon etch. In an embodiment, an isotropic silicon dry etch includes sulfur hexafluoride ($SF_6$). In an embodiment, an isotropic silicon dry etch includes xenon fluoride ($XeF_2$). In an embodiment, an anisotropic silicon wet etch includes potassium hydroxide (KOH) that can have a crystalline lattice etch ratio ((100):(111)) of about 400:1. In an embodiment, an anisotropic silicon wet etch includes ammonium hydroxide ($Na_4OH$) that can have a crystalline lattice etch ratio ((100):(111)) of about 8,000:1. In an embodiment, an anisotropic silicon wet etch includes tetramethyl ammonium hydroxide (TMAH) that can have a crystalline lattice etch ratio ((100):(111)) of about 10-35:1. In an embodiment, an anisotropic silicon wet etch includes edp (EDP) that can have a crystalline lattice etch ratio ((100):(111)) of about 35:1.

Figure 5F:
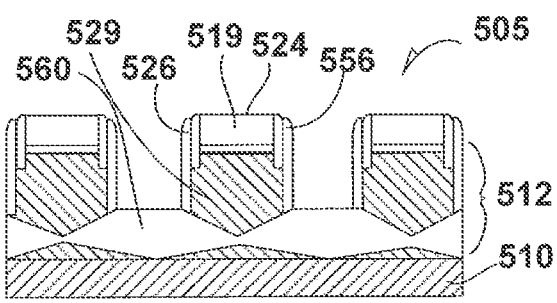

FIG. 5f shows a cross-section elevation of the semiconductor device depicted in FIG. 5e after further processing according to an embodiment. The semiconductor device 505 has been processed under conditions to cause a buried oxide structure 560 to fill the undercut 558 (FIG. 5e) and to further isolate any two adjacent, spaced-apart pillars 529.

In a process embodiment, the buried oxide structure 560 is formed by thermal oxidation. In a process embodiment, the buried oxide structure 560 is formed by spin-on dielectric (SOD) followed by an etchback process. As illustrated, the buried oxide structure may have a bird's beak shape as seen in cross-section.

Figure 5G:
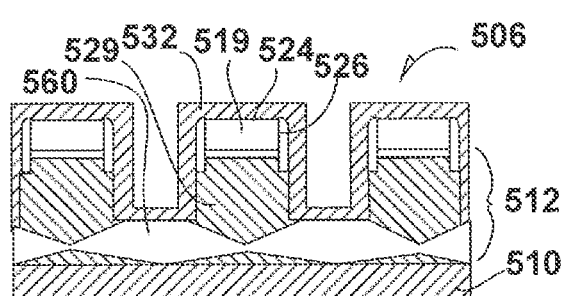

FIG. 5g shows a cross-section elevation of the semiconductor device depicted in FIG. 5e after further processing according to an embodiment. The semiconductor device 506 has been first processed to remove the second spacer 556 (FIG. 5f). Next, the semiconductor device 506 has been deposited with a first metal 532. The first metal 532 is used to form a silicide in the semiconductive upper substrate 512.

Figure 5H:
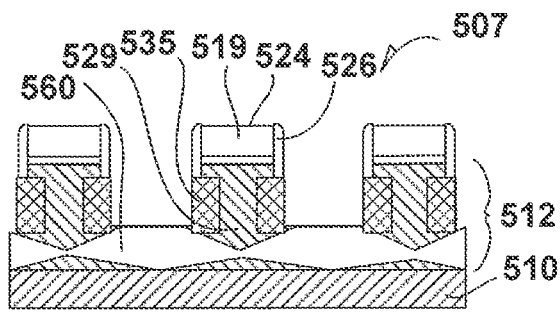

FIG. 5h shows a cross-section elevation of the semiconductor device depicted in FIG. 5g after further processing according to an embodiment. The semiconductor device 507 has been processed such that the first metal 532 has been reacted with the pillar 529 of the semiconductive upper substrate 512 to form a salicidation 535 (self-aligned silicidation) of the first metal 532. The salicidation melds into the semiconductive upper substrate 512 including into the pillar 529. A buried salicide word line 535 is formed by this process. In an embodiment, the first metal 532 is cobalt (Co), and the process has allowed the salicide word line 535 to form as cobalt silicide ($CoSi_2$) material. After salicidation, any excess first metal 532 has been removed with a stripping procedure that is selective to leaving the buried salicide word line 535 as well as the first hard mask 519 and the first spacer 526. Because of the buried oxide layer 560, leakage between neighboring diodes, and leakage into the substrate (as seen in FIG. 5k) is significantly, if not completely, eliminated. Further, improved cell-to-cell isolation is achieved by the elimination of lateral pnp bipolar junction transistor structures between adjacent word lines.

Figure 5J:
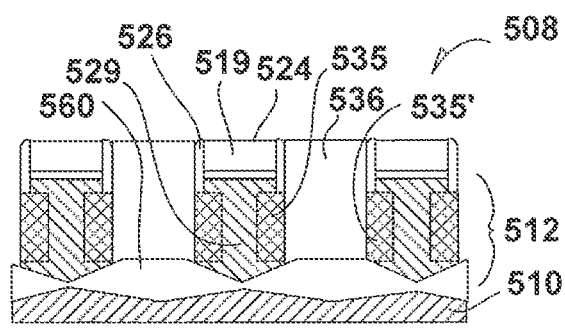
Figure 5K:
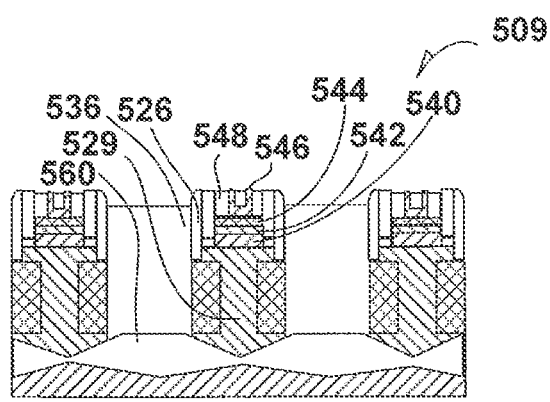

FIG. 5j shows a cross-section elevation of the semiconductor device depicted in FIG. 5h after further processing according to an embodiment. The semiconductor device 508 has been processed with an STI 536. Consequently, a given STI 536 completes isolation of neighboring salicide word lines 535. The STI 536 may be processed by a blanket deposition, followed by an etchback or a chemical-mechanical polishing that stops on the first hard mask 519.

FIG. 5k shows a cross-section elevation of the semiconductor device depicted in FIG. 5j after further processing according to an embodiment. The semiconductor device 509 has been processed with a fourth etch that has penetrated the first hard mask 519 and that exposes the pillar 529 at a pillar upper surface. The fourth etch includes an etch recipe that is selective to leaving the semiconductive material of the semiconductive upper substrate 512.

The semiconductor device 509 has also been processed by growing an epitaxial first film 540 upon the pillar 529 at the pillar upper surface. In an embodiment where the pillar 529 is an N+ silicon, the epitaxial first film 540 is an N− silicon. In an embodiment, formation of the epitaxial first film 540 is carried out by in situ N− doping during epitaxial growth. In an embodiment, formation of the epitaxial first film 540 is carried out by epitaxial growth, followed by light N− doping thereof. In an embodiment, the epitaxial first film 540 fills a via that has been etched into the first hard mask 519. In an embodiment, a counter-doped second film 542 is formed by P+ implantation into the surface of the epitaxial first film 540 by counter-doping.

After formation of the epitaxial first film 540 to form a diode 540, 542. The diode 540, 542 is formed by growing a second film 542 (epitaxial) above and on the epitaxial first film 540 according to an embodiment. In an embodiment, the second film 542 (counterdoped) is formed by ion implantation of P+ materials into the upper surface of the epitaxial first film 540. In an embodiment where the epitaxial first film 540 is an N− silicon, the second film 542 is a P+ silicon. In an embodiment, formation of the second film 542 is carried out by in situ P+ doping during epitaxial growth. In an embodiment, formation of the second film 542 is carried out by epitaxial growth, followed by heavy P+ doping thereof.

The semiconductor device 509 has also been processed to form a silicide contact 544. After formation of the diode 540, 542, silicidation of a portion of the second film 542 is carried out. In an embodiment, a cobalt film is deposited over the second film 542 and thermal conversion of a portion of the second film 542 is carried out. Consequently, the diode structure is altered and takes the form of the epitaxial first film 540, an altered second film 542. Salicidation has formed the silicide contact 544 above the second film 542.

Further processing includes the formation of a bottom electrode 546 in a dielectric film 548 such as a silicon oxide film or a silicon nitride film. The bottom electrode 546 is depicted as making contact with the silicide contact 544 and is illustrated as an open-ended cylinder. Other types of bottom electrodes may be formed as well such as a plug, a liner, and others. Accordingly, a buried salicide word line with a buried oxide semiconductor device 509 has been formed.

Further processing may be carried out to form a variable-resistance material memory such as the variable-resistance material memory 352 depicted in FIG. 3. Consequently, a top electrode may also be formed to be disposed above the variable-resistance material memory. In an embodiment, the variable-resistance material is any of the metal combinations set forth in this disclosure. In an embodiment, the variable-resistance material may be any of the metal oxide combinations set forth in this disclosure. In an embodiment, the variable-resistance material is any of the chalcogenide compounds set forth in this disclosure.

Figure 6:
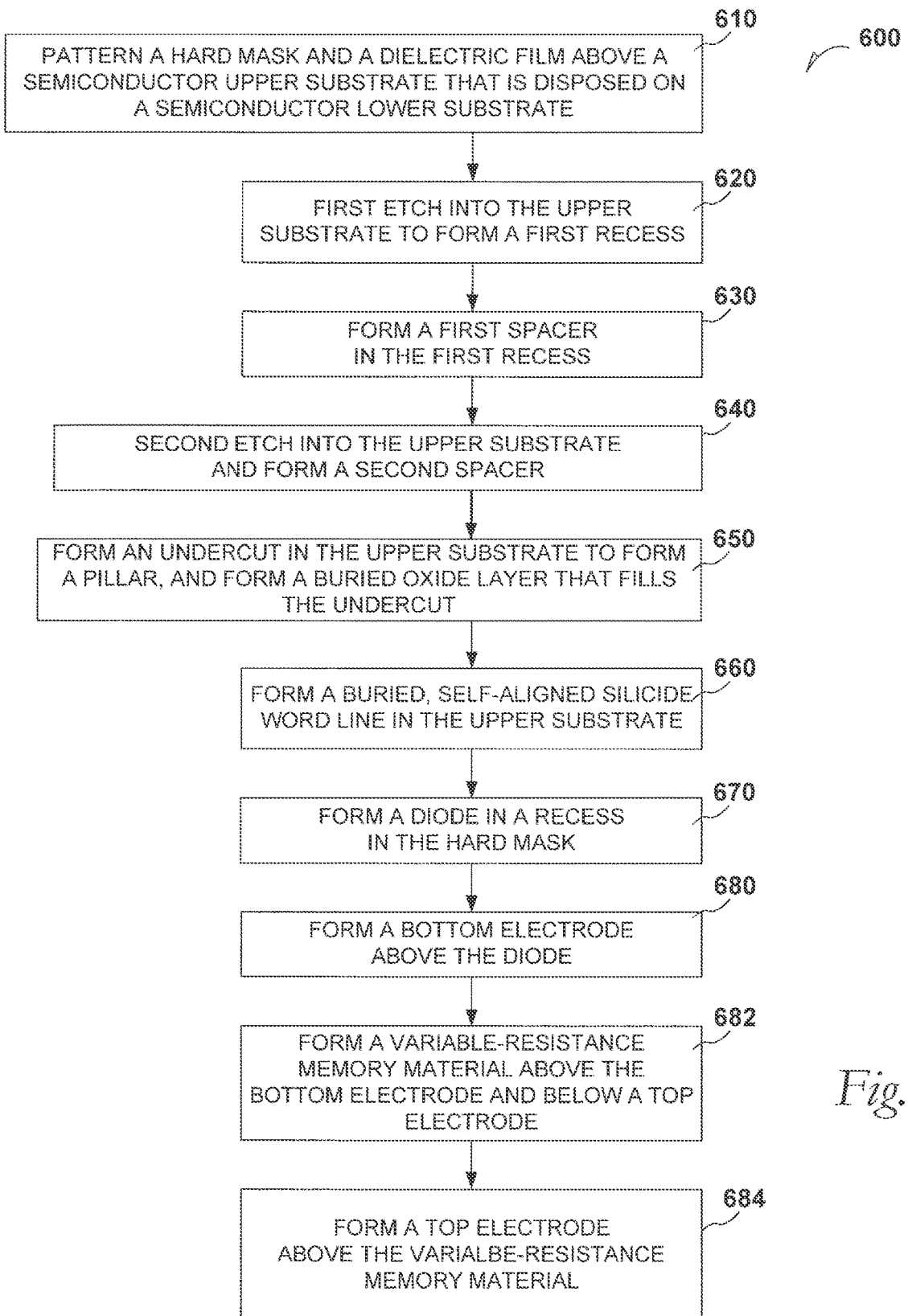
FIG. 6 shows a process flow for fabricating the structures depicted in FIGS. 5a through 5k according to an embodiment.

FIG. 6 shows a process flow 600 for fabricating the structures depicted in FIGS. 5a through 5k according to an embodiment.

At 610 a hard mask and dielectric film are patterned above a semiconductive upper substrate that is disposed on a semiconductive lower substrate.

At 620, a first etch penetrates into the upper surface to form a first recess with a first recess bottom in the semiconductive upper substrate.

At 630, the process includes forming a first spacer that fills into the first recess but that leaves the first recess bottom uncovered after a spacer etch.

At 640, the process includes a second etch that penetrates deeper into the semiconductive upper substrate and forms a second spacer that fills into the recess.

At 650, the process includes forming an undercut in the semiconductive upper substrate and forming a buried oxide layer that fills the undercut. The process also results in a more isolated pillar.

At 660, the process includes forming a buried, self-aligned, silicide word line in the semiconductive upper substrate. In a non-limiting example, the buried salicide word line is formed as depicted in FIG. 5g.

At 670, the process includes forming a diode in a recess in the hard mask that exposes previously protected semiconductive upper substrate material. In a non-limiting example, the diode is formed as illustrated in FIG. 5k.

At 680, the process includes forming a bottom electrode above the diode.

At 682, the process includes forming a variable-resistance material memory above the bottom electrode.

At 684, the process includes forming a top electrode above the variable-resistance material memory.

Figure 7A:
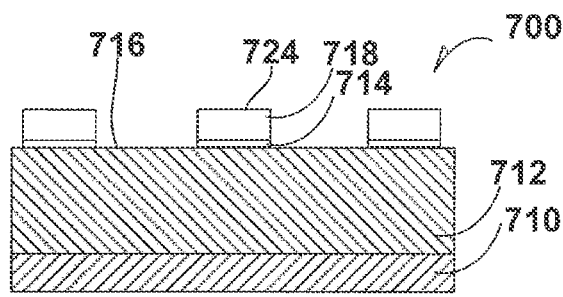
FIGS. 7a to 7f show cross-section elevations of a semiconductor device during processing according to an embodiment.

FIGS. 7a through 7f show cross-section elevations of a semiconductor device during processing according to an embodiment. In FIG. 7a, a cross-section elevation of a semiconductor device 700 is depicted during processing. A semiconductive lower substrate 710 has been formed below a semiconductive upper substrate 712. In an embodiment, the semiconductive lower substrate 710 is P− doped in comparison to the semiconductive upper substrate 712 that is N+ doped.

A dielectric film 714 such as silicon dioxide is formed upon the upper surface 716 of the semiconductive upper substrate 712. A first hard mask 718 is disposed above the dielectric film 714, and the hard mask 718 and the dielectric film 714 have been patterned to expose the upper surface 716. In an embodiment, the first hard mask 718 is a nitride material like silicon nitride such as $Si_3N_4$.

Figure 7B:
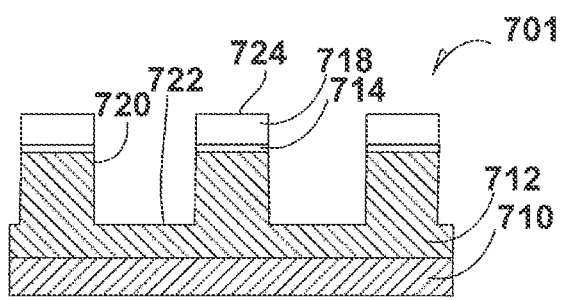

FIG. 7b shows a cross-section elevation of the semiconductor device depicted in FIG. 7a after further processing according to an embodiment. The semiconductor device 701 has been etched through the upper surface 716 (FIG. 7a) to form a first recess 720 including a first recess bottom 722. The first hard mask 718 also exhibits a vertically exposed surface 724 that facilitates a directional etch into the semiconductive upper substrate 712.

Figure 7C:
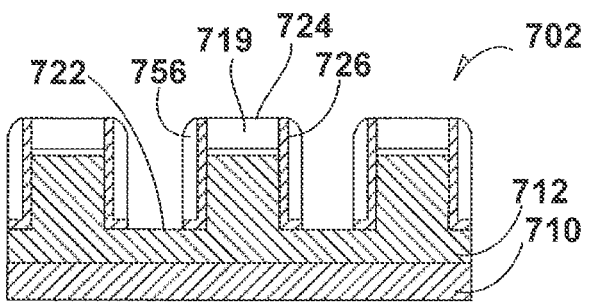

FIG. 7c shows a cross-section elevation of the semiconductor device depicted in FIG. 7b after further processing according to an embodiment. The semiconductor device 702 has been processed to form a first spacer 726 on the first hard mask 718. The first spacer 726 may be an adhesion film for a second spacer. A second spacer 756 is formed above the adhesion film 726. The first spacer 726 has been formed by blanket deposition. In an embodiment, the first hard mask 718 is a nitride material, and the first spacer 726 is a refractory metal nitride composition such as a titanium nitride material. The spacer etch of the first spacer 726 and the second spacer 756 may remove some nitride material upon the vertically exposed surfaces 724 of the first hard mask 718. Consequently, in an embodiment as depicted in FIG. 7c, the first hard mask 718 (FIG. 7b) may be slightly height-reduced to become the first hard mask 719.

FIG. 7c also show the formation of a metal second spacer 756 that is formed on the first spacer 726 and over the first hard mask 719. In an embodiment, the metal second spacer 756 is a refractory metal such as tungsten. In an embodiment, the metal second spacer 756 is a refractory metal such as tantalum. In an embodiment, the metal second spacer 756 is a refractory metal such as niobium.

Figure 7D:
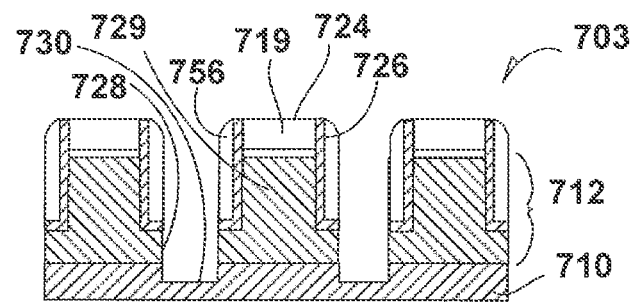

FIG. 7d shows a cross-section elevation of the semiconductor device depicted in FIG. 7c after further processing according to an embodiment. The semiconductor device 703 has been etched through the first recess bottom 722 (FIG. 7c) to form a second recess 728, a pillar 729 of some of the semiconductive upper substrate 712, and a second recess bottom 730 in some of the semiconductive upper substrate 712.

Figure 7E:
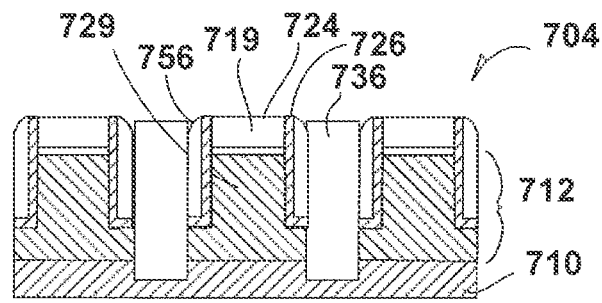

FIG. 7e shows a cross-section elevation of the semiconductor device depicted in FIG. 7d after further processing according to an embodiment. The semiconductor device 704 has been processed with an STI 736. Consequently, a given STI 736 facilitates isolation of neighboring metal spacer word lines 756. The STI 736 may be processed by a blanket deposition, followed by an etchback or a chemical-mechanical polishing that stops on the first hard mask 719.

Figure 7F:
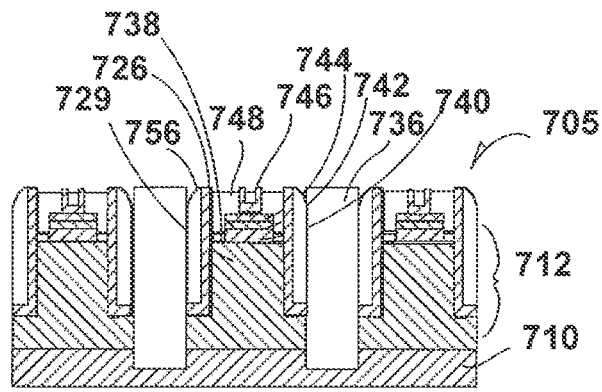

FIG. 7f shows a cross-section elevation of the semiconductor device depicted in FIG. 7e after further processing according to an embodiment. The semiconductor device 705 has been processed with a fourth etch that has penetrated the first hard mask 719 and that exposed the pillar 729 at a pillar upper surface 738. The fourth etch includes an etch recipe that is selective to leaving the semiconductive material of the semiconductive upper substrate 712.

The semiconductor device 705 has also been processed by growing an epitaxial first film 740 upon the pillar 729 at the pillar upper surface 738. In an embodiment where the pillar 729 is an N+ silicon, the epitaxial first film 740 is an N− silicon. In an embodiment, formation of the epitaxial first film 740 is carried out by in situ N− doping during epitaxial growth. In an embodiment, formation of the epitaxial first film 740 is carried out by epitaxial growth, followed by light N-doping thereof.

After formation of the epitaxial first film 740 to form a diode 740, 742, the diode 740, 742 is formed by growing a second film 742 above and on the epitaxial first film 740. In an embodiment where the epitaxial first film 740 is an N− silicon, the second film 742 is a P+ silicon. In an embodiment, formation of the second film 742 is carried out by in situ P+ doping during epitaxial growth. In an embodiment, formation of the second film 742 is carried out by epitaxial growth, followed by heavy P+ doping thereof. In an embodiment, the second film 742 is formed by P+ implantation of material into the upper surface of the epitaxial first film 740.

The semiconductor device 705 has also been processed to form a silicide contact 744. After formation of the diode 740, 742, silicidation of a portion of the second film 742 is carried out. In an embodiment, a cobalt film is deposited over the second film 742 and thermal conversion of a portion of the second film 742 is carried out. Consequently, the diode structure is altered and takes the form of the epitaxial first film 740, an altered second film 742. Salicidation has formed the silicide contact 744 above the second film 742.

Further processing includes the formation of a bottom electrode 746 in a dielectric film 748 such as a silicon oxide film or a silicon nitride film. The bottom electrode 746 is depicted as making contact with the silicide contact 744 and is illustrated as an open-ended cylinder. In an embodiment, the bottom electrode 746 may be a conductive plug, a liner, or other structure.

Further processing may be carried out to form a variable-resistance material memory such as the variable-resistance material memory 352 depicted in FIG. 3. Consequently, a top electrode may also be formed to be disposed above the variable-resistance material memory. In an embodiment, the variable-resistance material is any of the metal combinations set forth in this disclosure. In an embodiment, the variable-resistance material any of the metal oxide combinations set forth in this disclosure. In an embodiment, the variable-resistance material is any of the chalcogenide compounds set forth in this disclosure.

Figure 8:
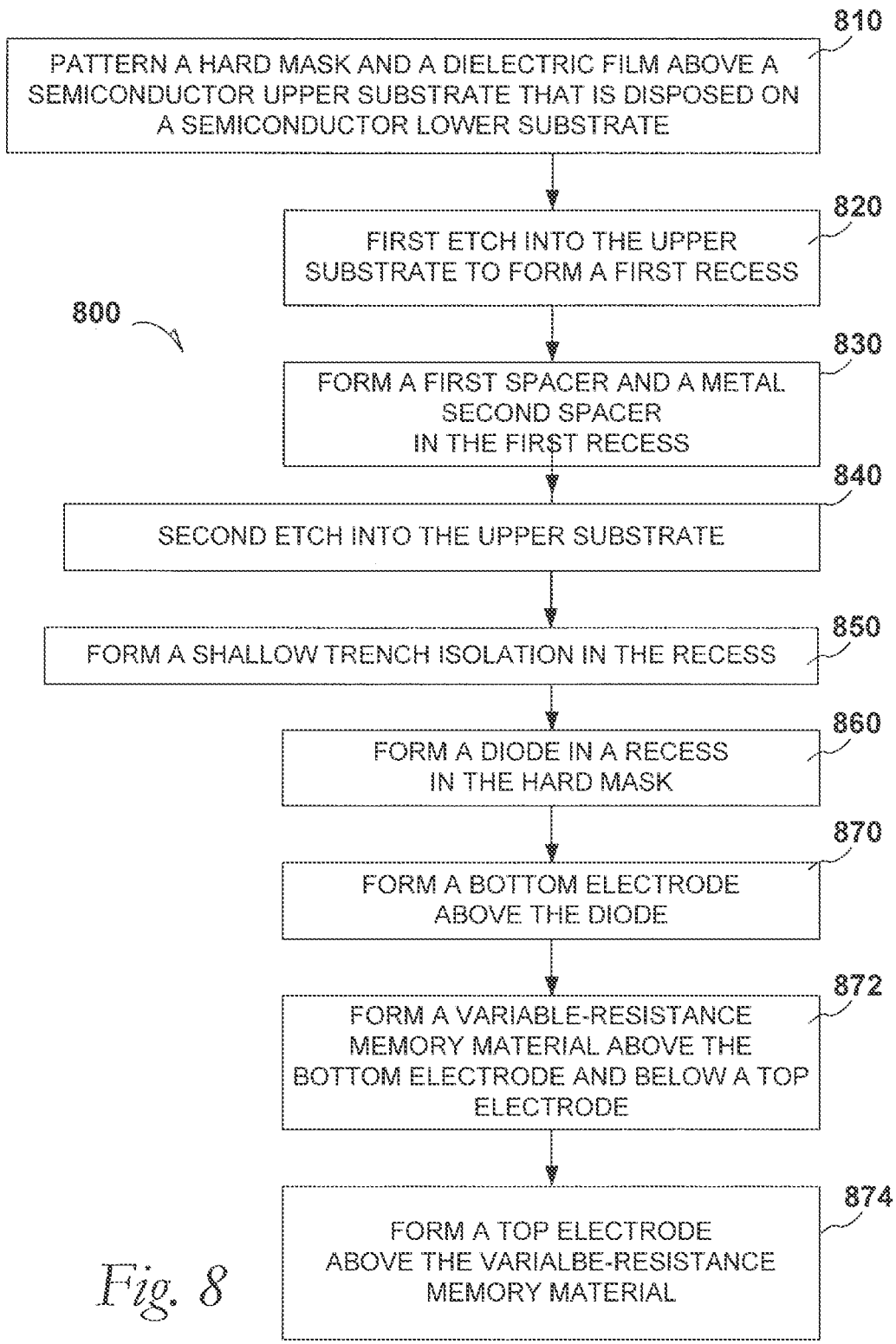
FIG. 8 shows a process flow for fabricating the structures depicted in FIGS. 7a through 7f according to an embodiment.

FIG. 8 is a shows a process flow 800 for fabricating the structures depicted in FIGS. 7a through 7k according to an embodiment.

At 810, a hard mask and dielectric film are patterned above a semiconductive upper substrate that is disposed on a semiconductive lower substrate.

At 820, a first etch penetrates into the upper surface to form a first recess with a first recess bottom in the semiconductive upper substrate.

At 830, the process includes forming a first and second spacer that fill into the first recess but that leave the first recess bottom uncovered after spacer etching.

At 840, the process includes a second etch that penetrates deeper into the semiconductive upper substrate.

At 850, the process includes forming a shallow trench isolation structure.

At 860, the process includes forming a diode in a recess in the hard mask that exposes previously protected semiconductive upper substrate material. In a non-limiting example, the diode is formed as illustrated in FIG. 7e.

At 870, the process includes forming a bottom electrode above the diode.

At 872, the process includes forming a variable-resistance material memory above the bottom electrode.

At 874, the process includes forming a top electrode above the variable-resistance material memory.

Figure 9A:
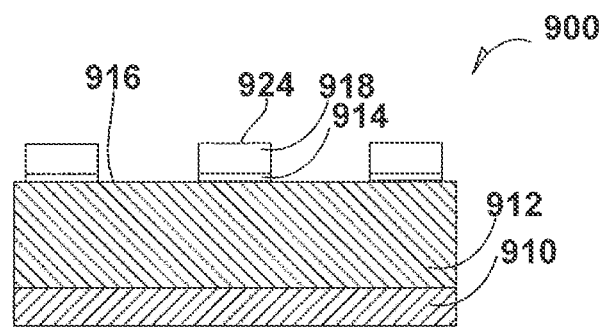
FIGS. 9a to 9f show cross-section elevations of a semiconductor device during processing according to an embodiment.

FIGS. 9a through 9f show cross-section elevations of a semiconductor device during processing according to an embodiment. In FIG. 9a, a cross-section elevation of a semiconductor device 900 is depicted during processing. A semiconductive lower substrate 910 has been formed below a semiconductive upper substrate 912. In an embodiment, the semiconductive lower substrate 910 is P− doped in comparison to the semiconductive upper substrate 912 that is N+ doped.

A dielectric film 914 such as silicon dioxide is formed upon the upper surface 916 of the semiconductive upper substrate 912. A first hard mask 918 is disposed above the dielectric film 914, and the hard mask 918 and the dielectric film 914 have been patterned to expose the upper surface 916. In an embodiment, the first hard mask 918 is a nitride material like silicon nitride such as $Si_3N_4$.

Figure 9B:
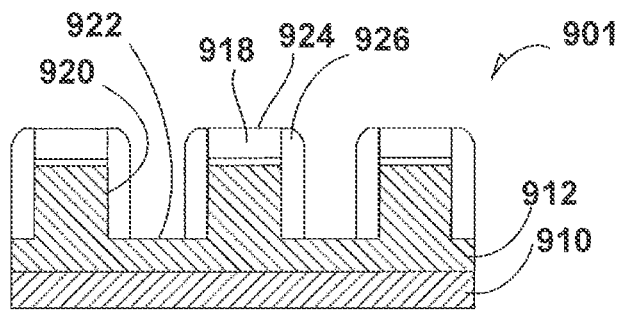

FIG. 9b shows a cross-section elevation of the semiconductor device depicted in FIG. 9a after further processing according to an embodiment. The semiconductor device 901 has been etched through the upper surface 916 (FIG. 9a) to form a first recess 920 including a first recess bottom 922. The first hard mask 918 also exhibits a vertically exposed surface 924 that facilitates a directional etch into the semiconductive upper substrate 912. The semiconductor device 901 has been processed to form a temporary spacer 926 on the first hard mask 918. The temporary spacer 926 has been formed by blanket deposition followed by a spacer etch. In an embodiment, the first hard mask 918 is a nitride material, and the temporary spacer 926 is also nitride material. The spacer etch of the temporary spacer 926 may remove some nitride material upon the vertically exposed surfaces 924 of the first hard mask 918. Consequently in an embodiment as depicted in FIG. 9c the first hard mask 918 (FIG. 9b) may be slightly height-reduced as the first hard mask 919.

Figure 9C:
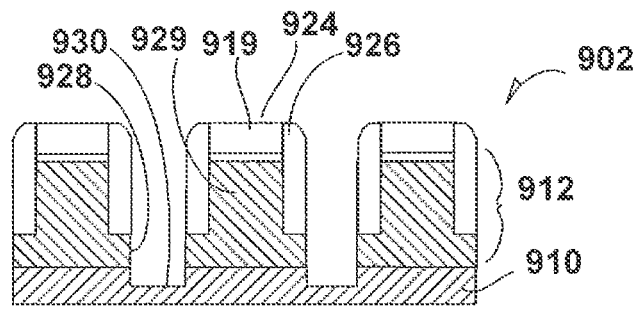

FIG. 9c shows a cross-section elevation of the semiconductor device depicted in FIG. 9b after further processing according to an embodiment. The semiconductor device 902 has been etched through the first recess bottom 922 (FIG. 9b) to form a second recess 928, a pillar 929 of some of the semiconductive upper substrate 912, and a second recess bottom 930 in some of the semiconductive upper substrate 912.

Figure 9D:
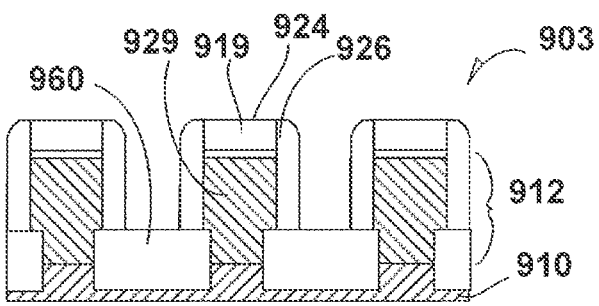

FIG. 9d shows a cross-section elevation of the semiconductor device depicted in FIG. 9c after further processing according to an embodiment. The semiconductor device 903 shows the formation of a buried oxide structure 960. In a process embodiment, the buried oxide structure 960 is formed by thermal oxidation. In a process embodiment, the buried oxide structure 960 is formed by SOD followed by an etchback process.

Figure 9E:
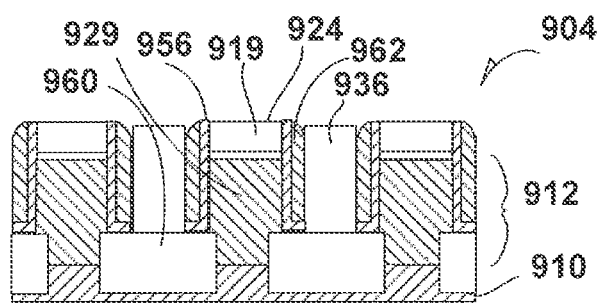

FIG. 9e shows a cross-section elevation of the semiconductor device depicted in FIG. 9d after further processing according to an embodiment. The temporary spacer has been removed. The semiconductor device 904 shows a metal nitride first spacer 956 and a metal second spacer 962. In an embodiment, the metal second spacer 962 is a refractory metal such as tungsten. In an embodiment, the metal second spacer 962 is a refractory metal such as tantalum. In an embodiment, the metal second spacer 962 is a refractory metal such as niobium.

The semiconductor device 904 has also been processed with an STI 936. Consequently, a given STI 936 facilitates isolation of neighboring metal spacer word lines 956. The STI 936 may be processed by a blanket deposition, followed by an etchback or a chemical-mechanical polishing that stops on the first hard mask 919.

Figure 9F:
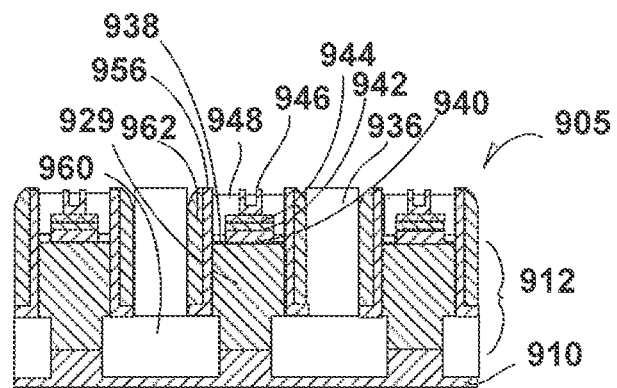

FIG. 9f shows a cross-section elevation of the semiconductor device depicted in FIG. 9e after further processing according to an embodiment. The semiconductor device 905 has been processed with a fourth etch that has penetrated the first hard mask 919 and that exposed the pillar 929 at a pillar upper surface 938. The fourth etch includes an etch recipe that is selective to leaving the semiconductive material of the semiconductive upper substrate 912.

The semiconductor device 905 has also been processed by growing an epitaxial first film 940 upon the pillar 929 at the pillar upper surface 938. In an embodiment where the pillar 929 is an N+ silicon, the epitaxial first film 940 is an N− silicon. In an embodiment, formation of the epitaxial first film 940 is carried out by in situ N− doping during epitaxial growth. As in other embodiments, the epitaxial first film may be etchback processed, followed by one of epitaxial growth or implantation to form a diode. In an embodiment, formation of the epitaxial first film 940 is carried out by epitaxial growth, followed by light N− doping thereof.

After formation of the epitaxial first film 940 to form a diode 940, 942. The diode 940, 942 is formed by growing a second film 942 above and on the epitaxial first film 940 according to an embodiment. In an embodiment the second film 942 is formed by P+ implantation into the upper surface of the epitaxial first film 940. In an embodiment where the epitaxial first film 940 is an N− silicon, the second film 942 is a P+ silicon. In an embodiment, formation of the second film 942 is carried out by in situ P+ doping during epitaxial growth. In an embodiment, formation of the second film 942 is carried out by epitaxial growth, followed by heavy P+ doping thereof.

The semiconductor device 905 has also been processed to form a silicide contact 944. After formation of the diode 940, 942, silicidation of a portion of the second film 942 is carried out. In an embodiment, a cobalt film is deposited over the second film 942 and thermal conversion of a portion of the second film 942 is carried out. Consequently, the diode structure is altered and takes the form of the epitaxial first film 940 and an altered second film 942. Salicidation has formed the silicide contact 944 above the second film 942.

Further processing includes the formation of a bottom electrode 946 in a dielectric film 948 such as a silicon oxide film or a nitride film. The bottom electrode 946 is depicted as making contact with the silicide contact 944 and is illustrated as an open-ended cylinder. Other types of bottom electrodes can be implemented such as plug bottom electrodes, liner electrodes, and others.

Further processing may be carried out to form a variable-resistance material memory such as the variable-resistance material memory 352 depicted in FIG. 3. Consequently, a top electrode may also be formed to be disposed above the variable-resistance material memory. In an embodiment, the variable-resistance material is any of the metal combinations set forth in this disclosure. In an embodiment, the variable-resistance material is any of the metal oxide combinations set forth in this disclosure. In an embodiment, the variable-resistance material is any of the chalcogenide compounds set forth in this disclosure.

Figure 10:
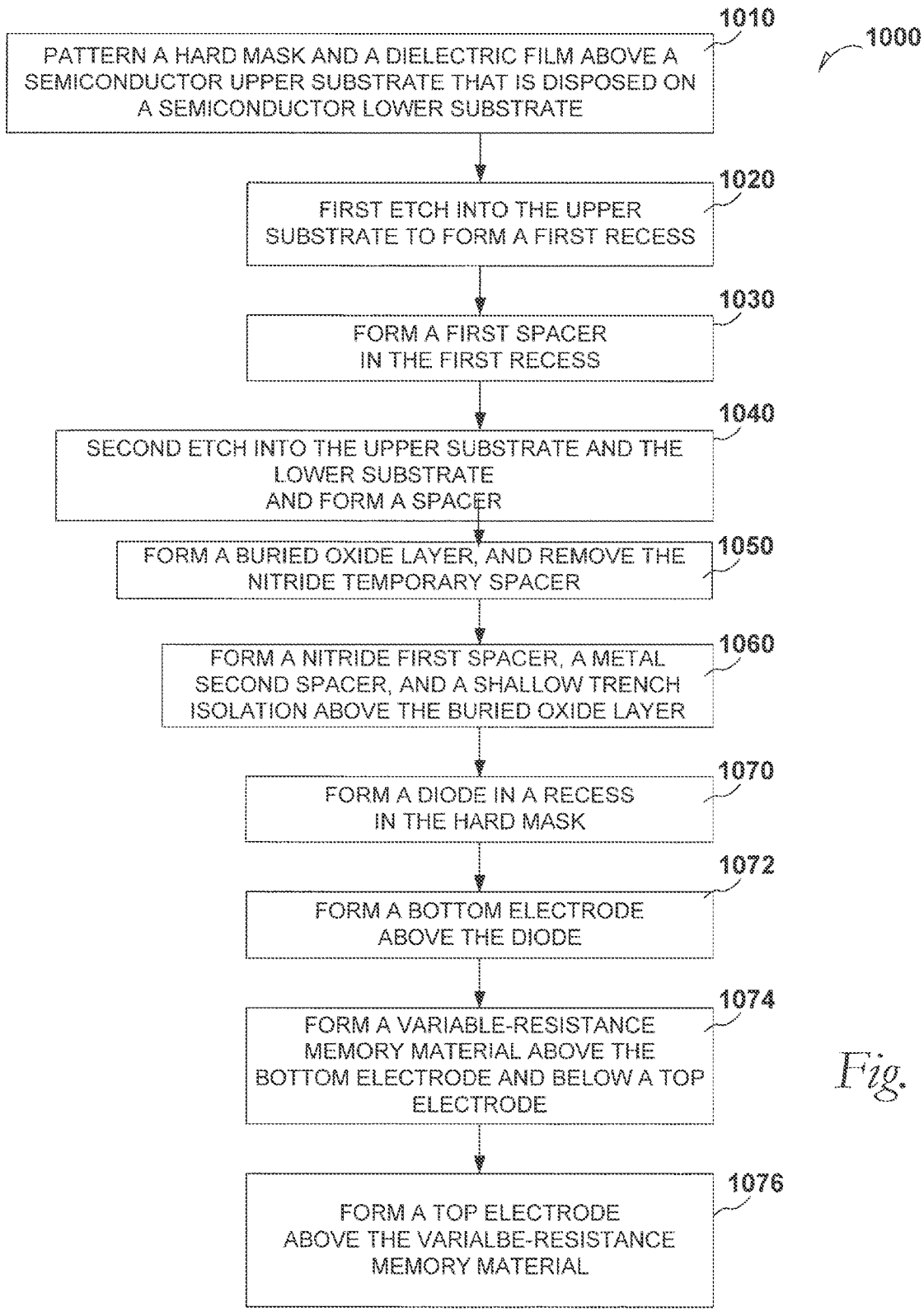
FIG. 10 shows a process flow for fabricating the structures depicted in FIGS. 9a through 9f according to an embodiment.

FIG. 10 is a shows a process flow 1000 for fabricating the structures depicted in FIGS. 9a through 9f according to an embodiment.

At 1010, a hard mask and dielectric film are patterned above a semiconductive upper substrate that is disposed on a semiconductive lower substrate.

At 1020, a first etch penetrates into the upper surface to form a first recess with a first recess bottom in the semiconductive upper substrate.

At 1030, the process includes forming a first spacer that fills into the first recess but that leaves the first recess bottom uncovered after spacer etching.

At 1040, the process includes a second etch that penetrates both the semiconductive upper substrate and the semiconductive lower substrate.

At 1050, the process includes forming a buried oxide structure, followed by removal of the nitride temporary spacer.

At 1060, the process includes forming a nitride first spacer, a metal second spacer, and a shallow trench isolation above the buried oxide.

At 1070, the process includes forming a diode in a recess in the hard mask that exposes previously protected semiconductive upper substrate material. In a non-limiting example, the diode is formed as illustrated in FIG. 9f.

At 1072, the process includes forming a bottom electrode above the diode.

At 1074, the process includes forming a variable-resistance material memory above the bottom electrode.

At 1076, the process includes forming a top electrode above the variable-resistance material memory.

Figure 11:
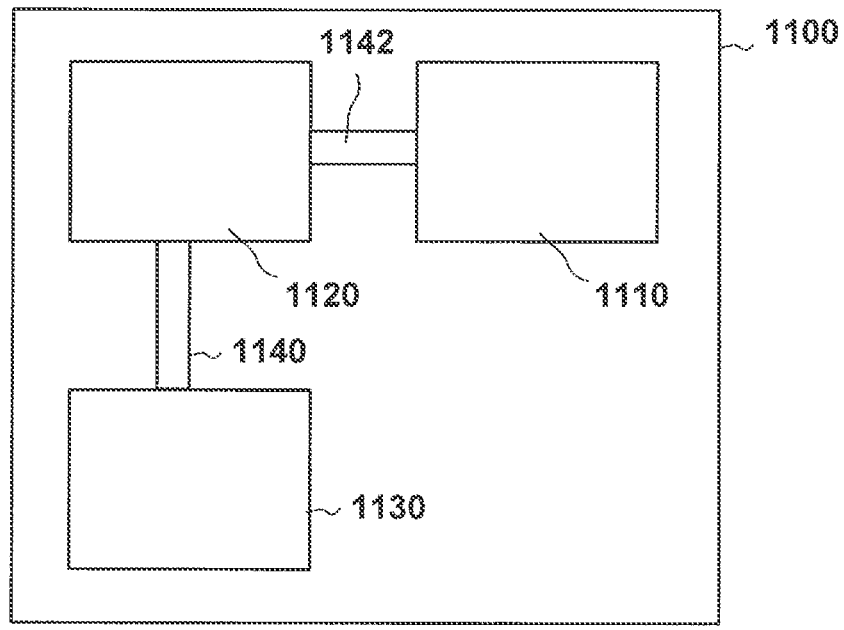
FIG. 11 shows a block diagram of an electronic device according to an embodiment.

FIG. 11 illustrates an electronic device 1100 that includes buried word line structures in connection with the variable-resistance material memory embodiments as described above. The electronic device 1100 includes a first component 1120 that benefits from variable-resistance material memory embodiments. Examples of first component 1120 include dynamic random-access memory arrays. In an embodiment, the first component 1120 is a processor that includes variable resistance material memory arrays that are used for booting up the processor. In these examples, device operation is improved with the presence of variable-resistance material memory embodiments.

In an embodiment, the device 1100 further includes a power source 1130. The power source 1130 is electrically connected to the first device component 1120 using interconnecting circuitry 1140. In an embodiment, the interconnecting circuitry 1140 includes variable-resistance material memory embodiments using processing methods described above. In addition to depositing material as described above, techniques such as lithography with masks and/or etching etc. can be used to pattern conducting circuitry.

In an embodiment, the device 1100 further includes a second device component 1110. The second device component 1110 is electrically connected to the first component 1120 using interconnecting circuitry 1142. Likewise, in one embodiment, the interconnecting circuitry 1142 includes variable-resistance material memory embodiments that are formed using methods described above. Examples of second device components 1110 include signal amplifiers, flash memory, logic circuitry, or other microprocessing circuits, etc. Aside from interconnecting circuitry, in an embodiment, the first device component 1120 and/or the second device component 1110 include variable-resistance material memory embodiments using methods described above.

Figure 12:
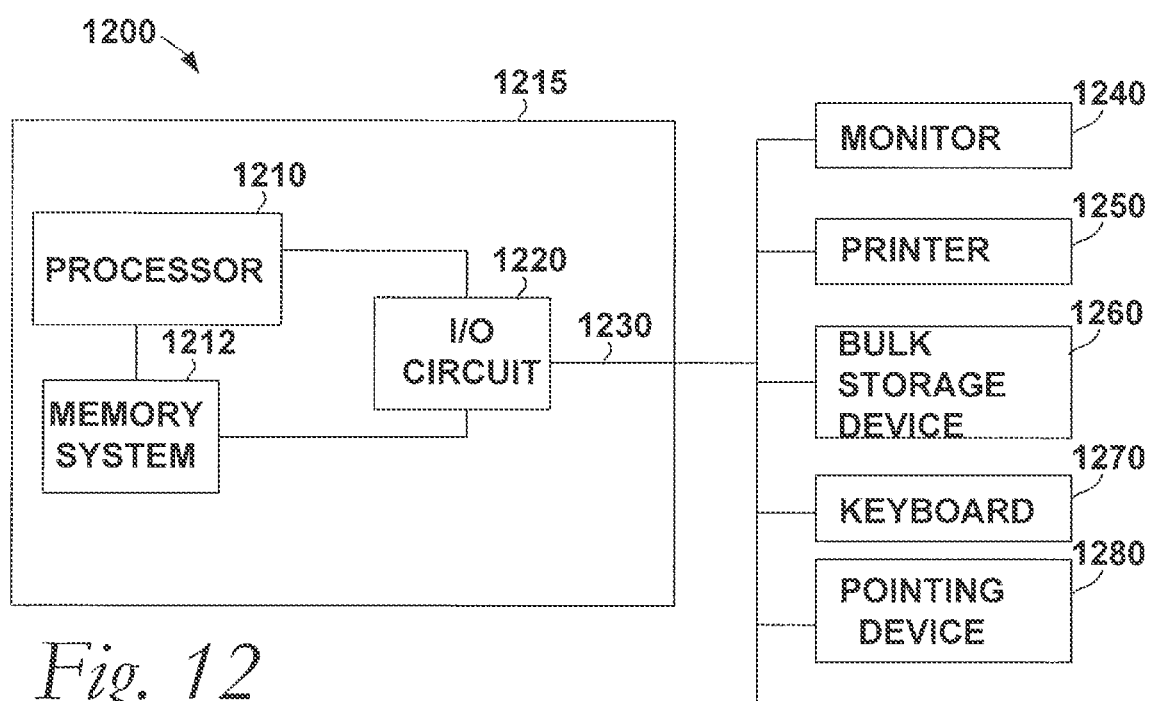
FIG. 12 shows a block diagram of an electronic device according to an embodiment.

FIG. 12 shows one specific example of a computer system including variable-resistance material memorys formed as described above. The computer system 1200 contains a processor 1210 and a memory system 1212 housed in a computer unit 1215. The computer system 1200 is but one example of an electronic system containing another electronic system. In an embodiment, the computer system 1200 contains an input/output (I/O) circuit 1220 that is coupled to the processor 1210 and the memory system 1212. In an embodiment, the computer system 1200 contains user interface components that are coupled to the I/O circuit 1220. In an embodiment, a variable-resistance material memory embodiment is coupled to one of a plurality of I/O pads or pins 1230 of the I/O circuit 1220. The I/O circuit 1220 can then be coupled to at least one of a monitor 1240, a printer 1250, a bulk storage device 1260, a keyboard 1270, and a pointing device 1280. It will be appreciated that other components are often associated with the computer system 1200 such as modems, device driver cards, additional storage devices, etc. It will further be appreciated that the processor 1210, the memory system 1212, the I/O circuit 1220, and partially isolated structures or data storage devices of computer system 1200 can be incorporated on a single integrated circuit. Such single package processing units may reduce the communication time between the processor 1210 and the memory system 1200.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be used and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term conductor is understood to include semiconductors and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A process of forming a memory structure, comprising:
   forming a first recess in a semiconductive substrate by use of a hard mask to define a pillar formed at least in part of a material of the semiconductive substrate;
   depositing a metal material within the first recess, and establishing conditions to form a silicide within the material of the semiconductive substrate surrounding the first recess;
   patterning the silicide to define a word line extending through the pillar;
   forming a second recess in the hard mask, the second recess exposing an upper surface of the pillar;
   forming a diode in the second recess; and
   forming a variable-resistance material coupled to the diode.

2. The process of claim 1, wherein the metal material is heated to form the word line extending through the pillar.

3. The process of claim 1, wherein forming the diode in the second recess in the hard mask comprises:
   etching the hard mask to form the second recess in the hard mask;
   forming an epitaxial first film on the upper surface of the pillar; and
   forming an epitaxial second film on the epitaxial first film.

4. The process of claim 3, wherein forming the variable-resistance material comprises siliciding a portion of the epitaxial second film to form a silicide contact.

5. The process of claim 4, wherein forming the variable-resistance material further comprises forming a bottom electrode on the silicide contact.

6. The process of claim 5, wherein forming the variable-resistance material further comprises forming the variable-resistance material on the bottom electrode.

7. The process of claim 6, wherein forming the variable-resistance erial further comprises forming a top electrode on the variable-resistance material.

8. The process of claim 7, further comprising forming a bit line above the variable-resistance material and coupled to the variable-resistance material via the top electrode.

9. The process of claim 1, wherein the word line includes cobalt silicide.

10. The process of claim 1, wherein the variable-resistance material is selected from an alloy, a quasi-metal composition, a metal oxide, and a chalcogenide.

11. The process of claim 1 wherein the variable-resistance material includes a phase-change material.

12. The process of claim 1, wherein the variable-resistance material includes one or more of a gallium-containing material, a germanium-containing material, an indium-containing material, an antimony-containing material, a tellurium-containing material, a selenium-containing material, an arsenic-containing material, an aluminum-containing material, a tin-containing material, a palladium-containing material, a silver-containing material, or a colossal magneto-resistive film.

13. The process of claim 1, wherein the variable-resistance material includes a doped chalcogenide glass of the general formula $A_xB_y$, B selected from sulfur, selenium, and tellurium, and mixtures thereof, and A includes at least one element from Group III-A, Group IV-A, Group V-A, or Group VII-A of the periodic table.

* * * * *